United States Patent
Hwang

(10) Patent No.: US 9,093,370 B2
(45) Date of Patent: Jul. 28, 2015

(54) MEMORY DEVICES WITH THREE-DIMENSIONAL SELECTION STRUCTURES FOR MEMORY CELL ARRAYS

(75) Inventor: Youngnam Hwang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 182 days.

(21) Appl. No.: 13/611,382

(22) Filed: Sep. 12, 2012

(65) Prior Publication Data

US 2013/0105876 A1 May 2, 2013

(30) Foreign Application Priority Data

Oct. 28, 2011 (KR) .................. 10-2011-0111235

(51) Int. Cl.
*H01L 29/788* (2006.01)
*H01L 27/24* (2006.01)
*H01L 45/00* (2006.01)

(52) U.S. Cl.
CPC ............. *H01L 27/249* (2013.01); *H01L 45/04* (2013.01); *H01L 45/06* (2013.01); *H01L 45/144* (2013.01); *H01L 45/146* (2013.01)

(58) Field of Classification Search
CPC ................................ H01L 27/088; G11C 5/05
USPC .................................. 257/314, E27.06; 365/72
See application file for complete search history.

(56) References Cited

U.S. PATENT DOCUMENTS

| | | | | |
|---|---|---|---|---|
| 7,696,559 B2* | 4/2010 | Arai et al. | | 257/316 |
| 7,906,818 B2* | 3/2011 | Pekny | | 257/390 |
| 8,008,698 B2* | 8/2011 | Lee et al. | | 257/296 |
| 8,319,275 B2* | 11/2012 | Shim et al. | | 257/324 |
| 8,329,513 B2* | 12/2012 | Pekny | | 438/129 |
| 8,618,614 B2* | 12/2013 | Scheuerlein | | 257/390 |
| 8,637,920 B2* | 1/2014 | Shim et al. | | 257/324 |
| 8,803,214 B2* | 8/2014 | Tang et al. | | 257/314 |
| 8,866,219 B2* | 10/2014 | Kim | | 257/331 |
| 2006/0186446 A1* | 8/2006 | Kim et al. | | 257/296 |
| 2006/0221758 A1* | 10/2006 | Petti et al. | | 365/230.06 |
| 2009/0121268 A1* | 5/2009 | Lee et al. | | 257/296 |

(Continued)

FOREIGN PATENT DOCUMENTS

| | | |
|---|---|---|
| JP | 2010-080685 | 4/2010 |
| JP | 2010-282673 | 12/2010 |

(Continued)

*Primary Examiner* — Caleb Henry
(74) *Attorney, Agent, or Firm* — Myers Bigel Sibley & Sajovec

(57) ABSTRACT

A memory device includes a selection structure disposed on a common conductive region and including an array of spaced-apart vertical semiconductor pillars electrically coupled to the common conductive region, first horizontal selection lines extending in parallel above the common conductive region and including sidewall surfaces that face sidewalls of the vertical semiconductor pillars, second horizontal selection lines extending in parallel above and transverse to the first horizontal selection lines and including sidewall surfaces that face sidewall surfaces of the vertical semiconductor pillars and at least one dielectric pattern interposed between the first horizontal selection lines and the vertical semiconductor pillars and between the second horizontal selection lines and the vertical semiconductor pillars. The memory device further includes a memory cell array disposed on the selection structure and comprising memory cells electrically coupled to the vertical semiconductor pillars.

20 Claims, 28 Drawing Sheets

(56) References Cited

U.S. PATENT DOCUMENTS

| | | |
|---|---|---|
| 2010/0078622 A1 | 4/2010 | Yoshimizu et al. |
| 2010/0254191 A1 | 10/2010 | Son et al. |
| 2010/0265750 A1* | 10/2010 | Yan et al. .................. 365/51 |
| 2011/0092033 A1* | 4/2011 | Arai et al. .................. 438/152 |
| 2013/0044531 A1* | 2/2013 | Baek et al. .................. 365/72 |
| 2013/0046920 A1* | 2/2013 | Ryu et al. .................. 711/103 |
| 2013/0065381 A1* | 3/2013 | Son et al. .................. 438/479 |
| 2013/0069137 A1* | 3/2013 | Pekny .................. 257/319 |
| 2013/0082316 A1* | 4/2013 | Son et al. .................. 257/315 |
| 2013/0095653 A1* | 4/2013 | Jin et al. .................. 438/622 |
| 2013/0147048 A1* | 6/2013 | Kuh et al. .................. 257/768 |
| 2013/0148400 A1* | 6/2013 | Murooka .................. 365/63 |
| 2013/0164907 A1* | 6/2013 | Lee .................. 438/400 |
| 2013/0223126 A1* | 8/2013 | Kwak et al. .................. 365/148 |
| 2013/0234222 A1* | 9/2013 | Yasuda et al. .................. 257/314 |
| 2013/0249053 A1* | 9/2013 | Lee .................. 257/532 |
| 2013/0260562 A1* | 10/2013 | Park et al. .................. 438/702 |
| 2013/0277731 A1* | 10/2013 | Goda et al. .................. 257/324 |
| 2014/0001530 A1* | 1/2014 | Song .................. 257/314 |
| 2014/0006859 A1* | 1/2014 | Ryu .................. 714/21 |
| 2014/0061767 A1* | 3/2014 | Nakaki .................. 257/324 |
| 2014/0063890 A1* | 3/2014 | Lee et al. .................. 365/63 |
| 2014/0065810 A1* | 3/2014 | Son et al. .................. 438/591 |
| 2014/0092685 A1* | 4/2014 | Yoon et al. .................. 365/185.17 |
| 2014/0104945 A1* | 4/2014 | Lee et al. .................. 365/185.05 |
| 2014/0124846 A1* | 5/2014 | Shim et al. .................. 257/314 |
| 2014/0153330 A1* | 6/2014 | Yoon et al. .................. 365/185.03 |
| 2014/0159137 A1* | 6/2014 | Yun et al. .................. 257/324 |
| 2014/0169105 A1* | 6/2014 | Oh .................. 365/185.29 |
| 2014/0254231 A1* | 9/2014 | Cernea et al. .................. 365/63 |
| 2014/0264525 A1* | 9/2014 | Takahashi et al. .................. 257/314 |

FOREIGN PATENT DOCUMENTS

| | | |
|---|---|---|
| JP | 2011-049561 | 3/2011 |
| KR | 1020110021444 A | 3/2011 |

* cited by examiner

MEMORY DEVICES WITH THREE-DIMENSIONAL SELECTION STRUCTURES FOR MEMORY CELL ARRAYS

REFERENCE TO PRIORITY APPLICATION

This patent application claims priority to Korean Patent Application No. 10-2011-0111235, filed Oct. 28, 2011, the contents of which are hereby incorporated herein by reference.

FIELD

This invention relates to memory devices and, more particularly, to memory devices including multi-dimensional memory cell arrays.

BACKGROUND

With the development of the electronics industry including, for example, mobile communications and computers, the demand for semiconductor devices having characteristics such as rapid read/write speed, nonvolatility, and/or lower operating voltage has increased. However, current memory devices, such as static random access memory (SRAM), dynamic random access memory (DRAM), and a flash memory, may not satisfy one or more of these requirements.

For example, as a unit cell of a DRAM typically includes a single capacitor and a single transistor for controlling the capacitor, a unit cell of a DRAM may require a larger area than a unit cell of a NAND flash memory. Moreover, a DRAM, which stores data in the capacitor, is a volatile memory device that needs a refresh operation. Further, an SRAM operates at high speed, but it is also a volatile memory device. Additionally, a unit cell of an SRAM may include 6 transistors, so a unit cell or an SRAM may also occupy a large area. Further, although flash memory is a nonvolatile memory device and (especially, for example, the NAND flash memory) has the highest integration density of presently discussed memory devices, flash memory operates at lower speed.

For at least the above-mentioned reasons, there have been extensive studies on new memory devices, which are capable of faster read/write operations, exhibit nonvolatility, need no refresh operations, and operate at lower voltage. A phase random access memory (PRAM), a magnetic RAM (MRAM) or a resistive RAM (ReRAM) are the next generation memory devices, which are candidates to satisfy the aforementioned technical requirements. For all that, a technology capable of realizing a memory capacity required from the market should be prepared so as to send these next generation memory devices into mass production.

SUMMARY

Some embodiments of the inventive subject matter provide a memory device including a common conductive region and a plurality of spaced apart vertical semiconductor pillars disposed on and electrically coupled to the common conductive region. The device also includes at least one first horizontal selection line adjacent at least one sidewall of at least one of the semiconductor pillars at a first level above the common conductive region and at least one second horizontal selection line adjacent the at least one sidewall of the at least one of the semiconductor pillars at a second level above the common conductive region. The device further includes a plurality of vertical electrodes, respective ones of which are disposed on and electrically coupled to respective ones of the semiconductor pillars and a plurality of horizontal electrodes stacked on the substrate and disposed adjacent sidewalls of the vertical electrodes. Variable-resistance memory elements are interposed between the vertical and horizontal electrodes.

In some embodiments, the semiconductor pillars may be two-dimensionally arranged on the common conductive region.

The common conductive region may have a width at least ten times greater than a width of each semiconductor pillar.

In further embodiments, the memory device may further include at least one dielectric region interposed between the sidewall of the at least one semiconductor pillar and the at least one first selection line and between the sidewall of the at least one semiconductor pillar and the at least one second selection line.

In some embodiments, the common conductive region may include a doped semiconductor layer. Each of the semiconductor pillars may include lower and upper regions adjacent the common conductive region and the vertical electrodes, respectively. The lower regions may have a different conductivity type and/or a different impurity concentration than the common conductive region.

According to some embodiments, each of the semiconductor pillars may include lower and upper regions disposed adjacent the common conductive region and the vertical electrodes, respectively. The at least one first selection line and the at least one second selection line may face the lower region of the semiconductor pillar. The lower regions may have a different conductivity type than the common conductive region and the upper regions may have the same conductivity type as the common conductive region.

In additional embodiments, the at least one first selection line differs from the at least one second selection line in thickness, impurity concentration, material, and/or width.

In some embodiments, the memory elements are configured to provide rectification. For example, each of the memory elements may include at least one variable resistance element and at least one pattern interposed between at least one of the horizontal and vertical electrodes and the variable resistance element and configured to provide rectification.

In further embodiments, the semiconductor pillars may pass through the at ones first selection line and the at least one second selection line.

In some embodiments, each of the vertical electrodes may include a first conductive region adjoining an inner sidewall of a memory element and a second conductive region disposed within a space defined by the first conductive region. A bottom surface of the second conductive region may be closer to an underlying semiconductor pillar than a bottom surface of the first conductive region. The first conductive region may be spaced apart from the underlying semiconductor pillar, and the second conductive region may be in direct contact with the underlying semiconductor pillar.

Each of the memory elements may include an information storing pattern including a vertical portion disposed between one of the horizontal electrodes and the first conductive region and a horizontal portion extending from a bottom of the vertical portion inward to cover a bottom surface of the first conductive region such that the first conductive region is separated from the underlying semiconductor pillar by the horizontal portion.

In some embodiments, the device may further include interlayer dielectric regions interposed between adjacent ones of the horizontal electrodes. The memory elements may be vertically separated from one another by the interlayer dielectric regions. The interlayer dielectric regions may be in direct contact with the vertical electrodes in spaces between the vertically separated memory elements.

In some embodiments, the vertical electrodes may pass through the horizontal electrodes. In some embodiments, the horizontal electrodes may include respective horizontal plates and/or the horizontal electrodes may include respective pluralities of parallel lines disposed at respective different levels above the common conductive region. The at least one second selection line may be disposed on a side of the at least one first selection line opposite the common conductive region, and the at least one second selection line may be aligned with the horizontal electrodes.

In some embodiments, selection gate dielectric regions may be disposed on sidewalls of the semiconductor pillars. Sidewalls of the semiconductor pillars may be covered by the selection gate dielectric regions. The selection gate dielectric regions may include a first dielectric region disposed at a level of the at least one first selection line and a second dielectric region disposed at a level of the at least one second selection line.

Further embodiments of the inventive subject matter provide a memory device including a common conductive region and a selection structure disposed on the common conductive region. The selection structure includes an array of spaced-apart vertical semiconductor pillars electrically coupled to the common conductive region, first horizontal selection lines extending in parallel above the common conductive region and including sidewall surfaces that face sidewalls of the vertical semiconductor pillars, second horizontal selection lines extending in parallel above and transverse to the first horizontal selection lines and including sidewall surfaces that face sidewall surfaces of the vertical semiconductor pillars and at least one dielectric pattern interposed between the first horizontal selection lines and the vertical semiconductor pillars and between the second horizontal selection lines and the vertical semiconductor pillars. The memory device further includes a memory cell array disposed on the selection structure and including memory cells electrically coupled to the vertical semiconductor pillars.

In some embodiments, the vertical semiconductor pillars may pass through the first and second horizontal selection lines.

In some embodiments, the memory cell array may include a three-dimensional memory cell array. The three-dimensional memory cell array may include vertical electrodes, respective ones of which are disposed on and electrically coupled to respective ones of the semiconductor pillars, a plurality of horizontal electrodes stacked above the selection structure and including sidewall surfaces that face sidewall surfaces of the vertical electrodes and variable-resistance memory elements interposed between the vertical and horizontal electrodes. The vertical electrodes may pass through openings in the horizontal electrodes. The horizontal electrodes may include a stack of plate electrodes and/or pluralities of parallel lines disposed at respective levels above the selection structure.

BRIEF DESCRIPTION OF THE DRAWINGS

Example embodiments will be more clearly understood from the following brief description taken in conjunction with the accompanying drawings.

FIG. 1 is a perspective view schematically illustrating a cell array region of a semiconductor memory device according to example embodiments of the inventive subject matter;

FIG. 2 is a perspective view exemplarily illustrating a selection structure according to example embodiments of the inventive subject matter;

FIGS. 3 and 4 are sectional views of the selection structures according to example embodiments of the inventive subject matter;

FIG. 5 is a perspective view exemplarily illustrating a selection structure according to other example embodiments of the inventive subject matter;

FIGS. 6 through 8 are perspective views exemplarily illustrating memory structures according to example embodiments of the inventive subject matter;

FIGS. 9 through 12 are sectional views of the memory structures according to example embodiments of the inventive subject matter;

FIG. 13 is a perspective view illustrating some aspects of the memory structures according to example embodiments of the inventive subject matter;

FIGS. 14 and 15 are sectional views exemplarily illustrating unit cell structures according to example embodiments of the inventive subject matter;

FIG. 16 is a plan view illustrating some examples of the cell array region of the semiconductor memory device;

FIGS. 17 and 18 are perspective views illustrating examples of the cell array region of FIG. 16;

FIGS. 19 and 20 are plan and perspective views illustrating other examples of the cell array region of the semiconductor memory device;

FIGS. 21 and 22 are plan and perspective views illustrating still other examples of the cell array region of the semiconductor memory device;

FIGS. 23 and 24 are plan and perspective views illustrating yet other examples of the cell array region of the semiconductor memory device;

FIGS. 25 through 27 are sectional views exemplarily illustrating connection structures between the memory structure and the selection structure according to example embodiments of the inventive subject matter; and FIGS. 28 and 29 are block diagrams schematically illustrating electronic devices including the semiconductor device according to example embodiments of the inventive subject matter.

Figure 1:
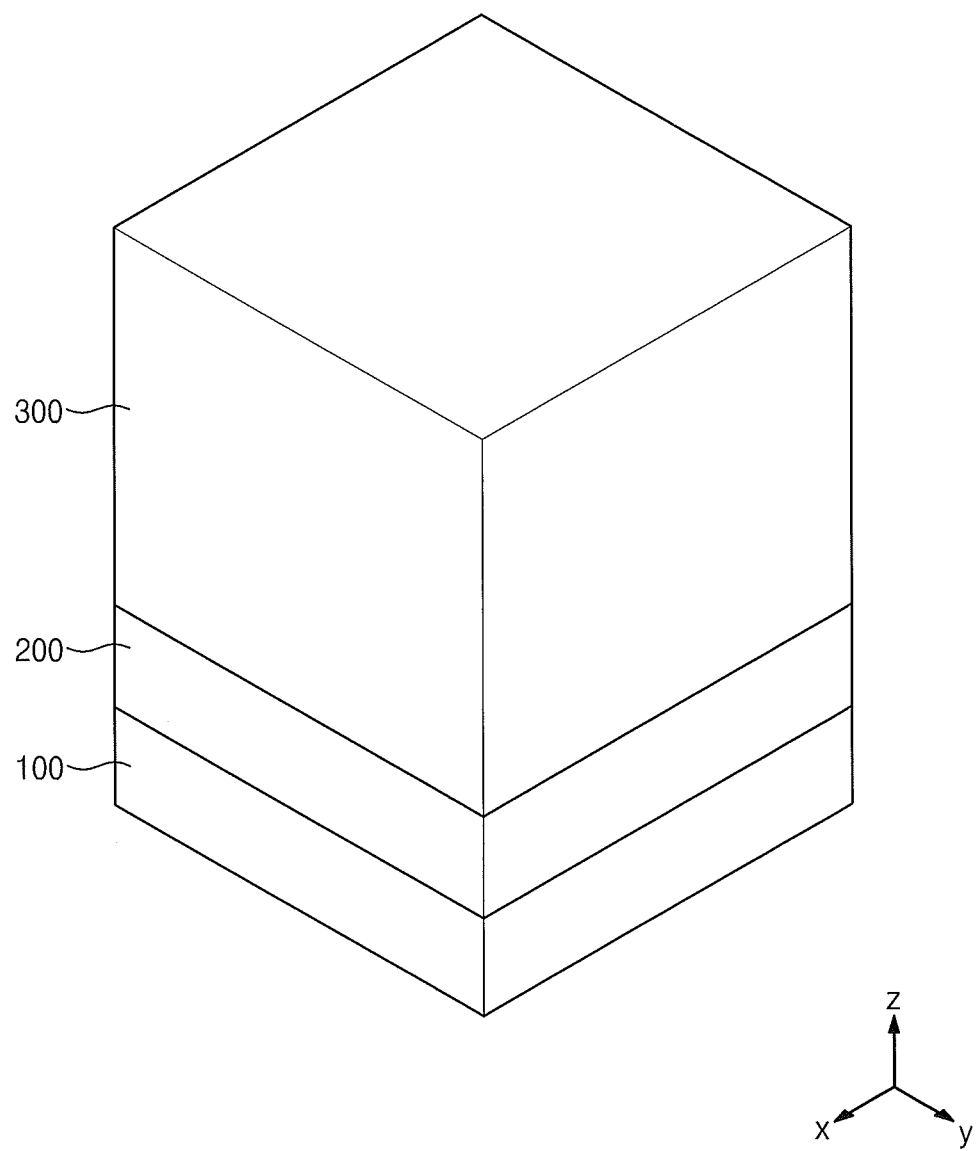
FIGS. 1 through 29 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive subject matter will now be described more fully with reference to the accompanying drawings, in which example embodiments are shown. Example embodiments of the inventive subject matter may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive subject matter are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive subject matter should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive subject matter belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view schematically illustrating a cell array region of a semiconductor memory device according to example embodiments of the inventive subject matter.

Referring to FIG. 1, a cell array region of a semiconductor memory device may include a lower structure 100, a memory structure 300 on the lower structure 100, and a selection structure 200 between the lower structure 100 and the memory structure 300.

In example embodiments, the lower structure 100 may serve as a base structure for forming the selection structure 200 and the memory structure 300. For example, the lower structure 100 may be a substrate including semiconductor regions, dielectric regions and/or conductive materials. In some example embodiments, the lower structure 100 may include a silicon wafer or a silicon substrate.

The memory structure 300 may include three-dimensionally arranged memory cells. For example, the memory cells may be arranged as a stack of two-dimensional arrays formed substantially on x-y planes at different vertical (z) levels above the lower structure 100. The memory structure 300 may include a plurality of horizontal electrodes, which lie substantially on x-y planes parallel to the lower structure 100, and a plurality of vertical electrodes crossing the horizontal electrodes. The memory cells may be interposed between the horizontal and vertical electrodes.

The selection structure 200 may be configured to be able to select uniquely one of the vertical electrodes in the memory structure 300. For example, the selection structure 200 may include selection devices arranged two-dimensionally or three-dimensionally on the lower structure 100, and the selection devices may be physically connected to the corresponding one of the vertical electrodes. As will be described in more detail with reference to several examples, the selection devices may be configured in such a way that they are electrically connected to the vertical electrodes.

Figure 2:
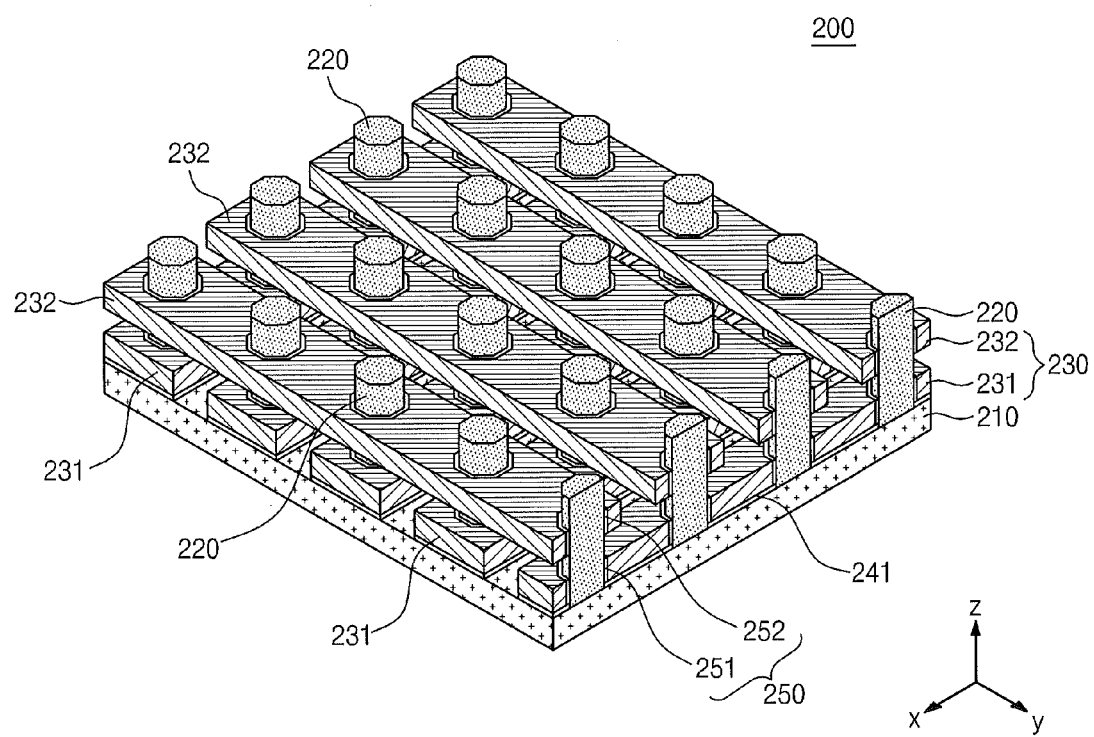
Figure 3:
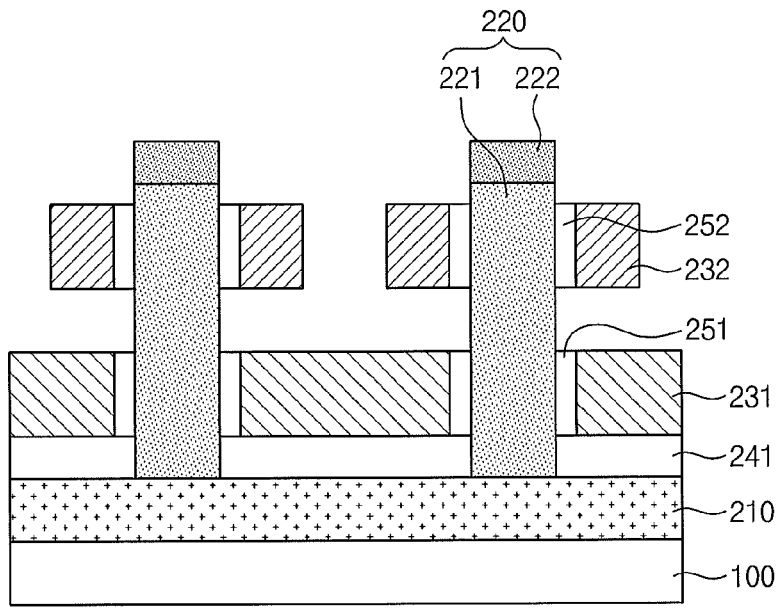
Figure 4:
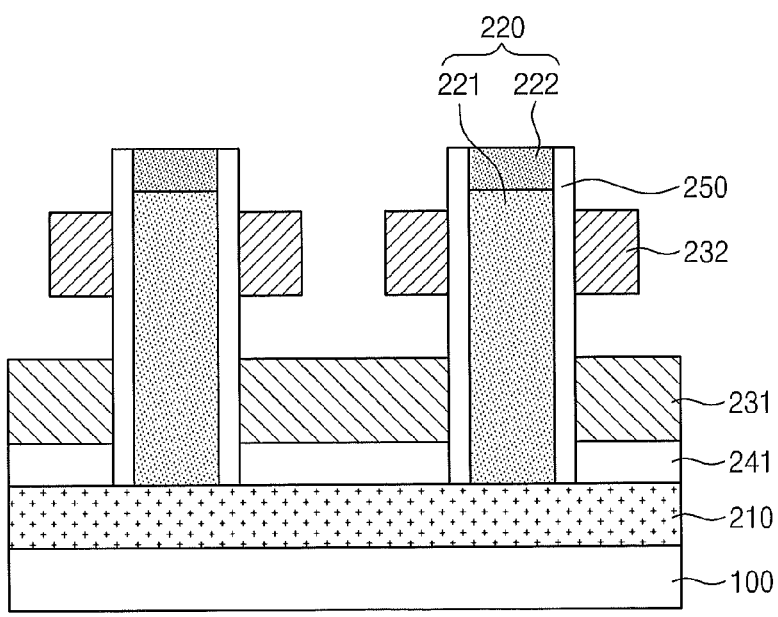

FIG. 2 is a perspective view exemplarily illustrating a selection structure according to example embodiments of the inventive subject matter, and FIGS. 3 and 4 are sectional views of the selection structures according to example embodiments of the inventive subject matter.

Referring to FIG. 2, the selection structure 200 may include a conductive region 210, semiconductor pillars 220 disposed on the conductive region 210, and selection lines 230 disposed on the conductive region 210 and horizontally crossing the semiconductor pillars 220.

The conductive region 210 may serve as a pathway allowing communication of electrical signals (e.g., current or voltage) between the memory structure 300 and an external circuit. In example embodiments, the external circuit may be a portion of the semiconductor memory device positioned outside the cell array region. The conductive region 210 may be formed of one or more materials having a resistivity that is lower than that of the lower structure 100 or the silicon substrate. For example, the conductive region 210 may include at least one of doped semiconductor, metals, conductive metal nitrides, silicides, and nanostructures (such as carbon nanotubes or graphene). In example embodiments, the lower structure 100 may be a silicon substrate, and the conductive region 210 may be a highly doped impurity region with a conductivity type that is different from that of the silicon substrate. For example, the conductive region 210 may be formed by doping the silicon substrate with impurities with a conductivity type that is different from that of the silicon substrate.

The semiconductor pillars 220 may be formed of a material capable of exhibiting a non-ohmic contact resistance property at an area of contact with the conductive region 210. For example, the semiconductor pillars 220 may include a semiconductor layer or a nanostructure (such as a carbon nanotube or a grapheme structure) with a Fermi level that differs from that of the conductive region 210. For example, if the conductive region 210 is formed of doped semiconductor material, the semiconductor pillars 220 may include a portion with a conductivity type that is different from that of the conductive region 210. For example, as shown in FIGS. 3 and 4, each of the semiconductor pillars 220 may include an upper region 222 and a lower region 221 interposed between the upper region 222 and the conductive region 210, and in example embodiments, the upper region 222 may have the same conductivity type as the conductive region 210 and the lower region 221 may have a different conductivity type than that of the upper region 222.

The semiconductor pillars 220 may have a single-crystal or polycrystalline structure. In example embodiments, each of the semiconductor pillars 220 may include an epitaxial layer grown by using the conductive region 210 or the silicon substrate as a seed layer. In some embodiments, the semiconductor pillar 220 may be in direct contact with a top surface of the conductive region 210, with little or no observable interfacial crystal defects.

The semiconductor pillars 220 may be two-dimensionally arranged on the conductive region 210. For example, the semiconductor pillars 220 may be connected in common to the conductive region 210, and the conductive region 210 may serve as a common interconnection line shared by the semiconductor pillars 220. In this sense, the conductive region 210 may serve as a "common source region," and may be referred to as such in the following description. In example embodiments, each of the semiconductor pillars 220 may have a solid cylindrical shape and the semiconductor pillars 220 may be spaced apart from one another.

The selection lines 230 may face sidewalls of the semiconductor pillars 220. The arrangement of the selection lines 230 and the semiconductor pillars 220 may form metal-oxide-semiconductor (MOS) capacitors and/or the selection lines 230 may serve as gate electrodes of MOS field effect transistors, in which the upper and lower regions 222 and 221 of the semiconductor pillars 220 serve as drain electrodes and channel regions, respectively. To provide such transistors, the selection structure 200 may further include selection gate dielectrics 250 interposed between the selection lines 230 and the semiconductor pillars 220. Each selection line 230 may be configured to control an electric potential of at least one of the semiconductor pillars 220 adjacent thereto by capacitive coupling. For example, an energy band structure of the semiconductor pillar 220 may be inverted by applying a voltage to one of the selection lines 230 adjacent thereto, and the selection gate dielectric 250 may be formed to have a thickness allowing the energy band structure to be inverted.

In example embodiments, the selection lines 230 may include a plurality of first selection lines 231 arranged on a first x-y plane and a plurality of second selection lines 232 arranged on a second x-y plane at a different level than the first selection lines 231. The first selection lines 231 may cross the second selection lines 232. For example, the first selection lines 231 may extend in parallel along the x direction, and the second selection lines 232 may be disposed over the first selection lines 231 and extend in parallel in the y direction. However, example embodiments of the inventive subject matter may not be limited to such an arrangement.

The first and second selection lines 231 and 232 may face sidewalls of the one-dimensionally arranged ones of the semiconductor pillars 220. The first and second selection lines 231 and 232 may serve as electrodes of MOS capacitors or as gate electrodes of MOS field effect transistors. In example embodiments, the first and second selection lines 231 and 232 may holes therein and the semiconductor pillars 220 may penetrate the holes.

In this example, each of the selection gate dielectrics 250 may be disposed on an inner wall of the corresponding one of the holes to separate the selection line 230 spatially and electrically from the semiconductor pillar 220. For example, as exemplarily shown in FIGS. 2 and 3, the selection gate dielectrics 250 may include first insulating patterns 251, which are disposed in the first selection lines 231, and second insulating patterns 252, which are disposed in the second selection lines 232 and vertically spaced apart from the first insulating patterns 251. Alternatively, each of the selection gate dielectrics 250 may extend upward from the first selection line 231 to be interposed between the second selection line 232 and the semiconductor pillar 220. For example, as exemplarily shown in FIG. 4, an entire sidewall of each of the semiconductor pillars 220 may be covered with the corresponding one of the selection gate dielectrics 250.

As described above, in this example, the first and second selection lines 231 and 232 may cross each other, and this enables to selectively connect the upper region 222 in one of the semiconductor pillars 220 to the conductive region 210. For example, if one of the first selection lines 231 and one of the second selection lines 232 are selected, the lower region 221 positioned at its intersection may have uniquely an inverted energy band structure.

Meanwhile, in order to connect the upper region 222 electrically to the conductive region 210, it is at least required that two portions of the semiconductor pillar 220, which are adjacent to the first and second selection lines 231 and 232, respectively, have the inverted energy band structure and are electrically connected to each other. This requirement may be satisfied by two ways. For example, the lower region 221 may further include a connection impurity region (not shown), which is formed between the first and second selection lines 231 and 232 in terms of vertical level and have the same conductivity type as the upper region 222. Then, two portions of the semiconductor pillar 220 inverted by the first and second selection lines 231 and 232 may be connected in series with each other through the connection impurity region. Alternatively, the first and second selection lines 231 and 232 may be vertically close enough to allow the inverted two portions to overlap each other. Then, the two inverted portions of the semiconductor pillar 220 may be directly connected in series with each other.

In example embodiments, the first selection lines 231 may be different from the second selection lines 232 in terms of at least one of thickness, impurity concentration, material or width. This difference between the first and second selection lines 231 and 232 may be used to control electric characteristics of MOS field effect transistors using the semiconductor pillars 220 as active regions thereof.

In example embodiments, the first selection lines 231 and the second selection lines 232 may be electrically isolated from the semiconductor pillars 220 and the conductive region 210. For example, the selection structure 200 may further include at least one insulating layer interposed between the first selection lines 231, between the first selection lines 231 and the conductive region 210, and/or between the second selection lines 232. For example, a first insulating layer 241 may be interposed between the first selection lines 231 and the conductive region 210.

Figure 5:
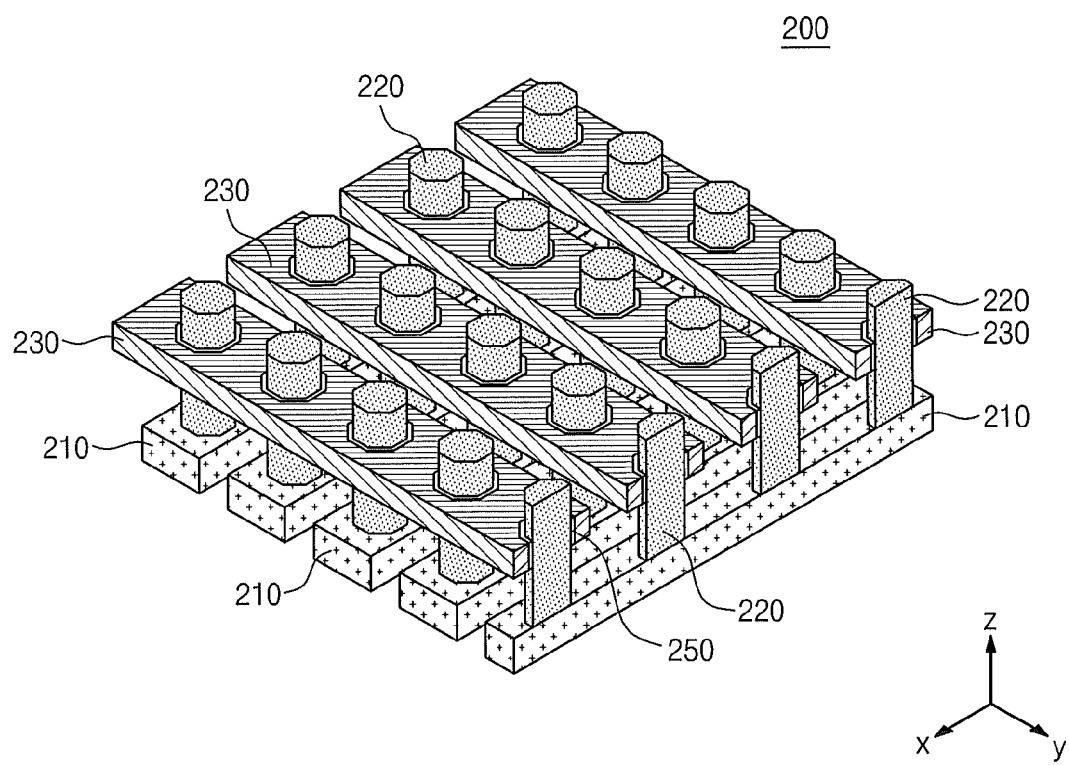

FIG. 5 is a perspective view exemplarily illustrating a selection structure according to other example embodiments of the inventive subject matter. For concise description, overlapping description of elements previously described with reference to FIGS. 2 through 4 may be omitted.

Referring to FIG. 5, according to the present example embodiments, the conductive region 210 may include a plurality of line portions (hereinafter, referred to as "common source lines") that are horizontally separated from each other, and all of the selection lines 230 may be disposed on a single xy plane to cross the common source lines 210.

In example embodiments, the common source lines 210 may be parallel to each other, and each of them may be connected to a plurality of the semiconductor pillars 220 disposed thereon. The semiconductor pillars 220 connected to a common source line 210 may penetrate the selection lines 230. For example, the common source lines 210 may be configure to connect semiconductor pillars 220 together and the selection lines 230 may face sidewalls of plural ones of the semiconductor pillars 220 along a direction crossing the common source line 210. Accordingly, if one of the common source lines 210 and one of the selection lines 230 are selected, the corresponding one of the semiconductor pillars 220 positioned at the intersection of the common source line 210 and the selection ling 230 can be uniquely selected.

According to the present example embodiments, the common source line 210, the lower region 221, and the upper region 222 may serve as a source electrode, a channel region, and a drain electrode of MOS field effect transistor in which the selection line 230 is used for a gate electrode. In addition, the selection gate dielectrics 250 may be interposed between the semiconductor pillars 220 and the selection lines 230 to serve as gate insulating layers of the MOS field effect transistors.

Figure 6:
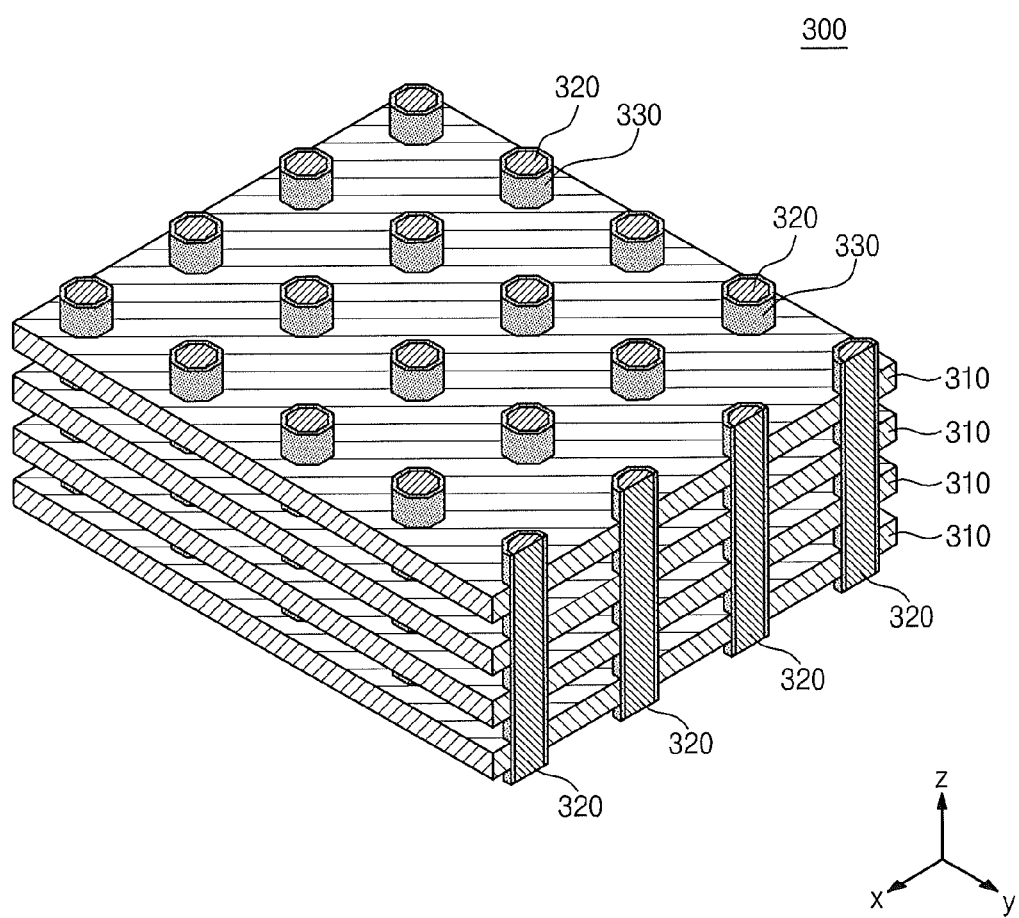
Figure 7:
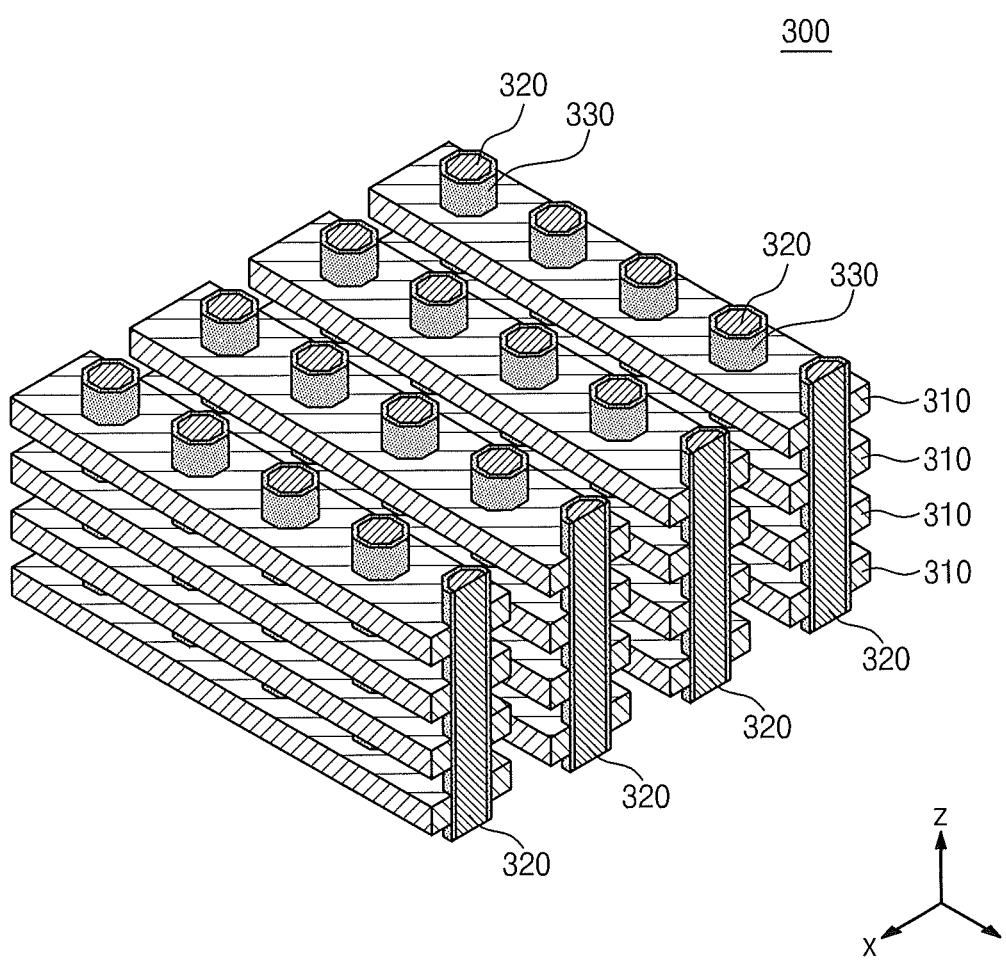
Figure 8:
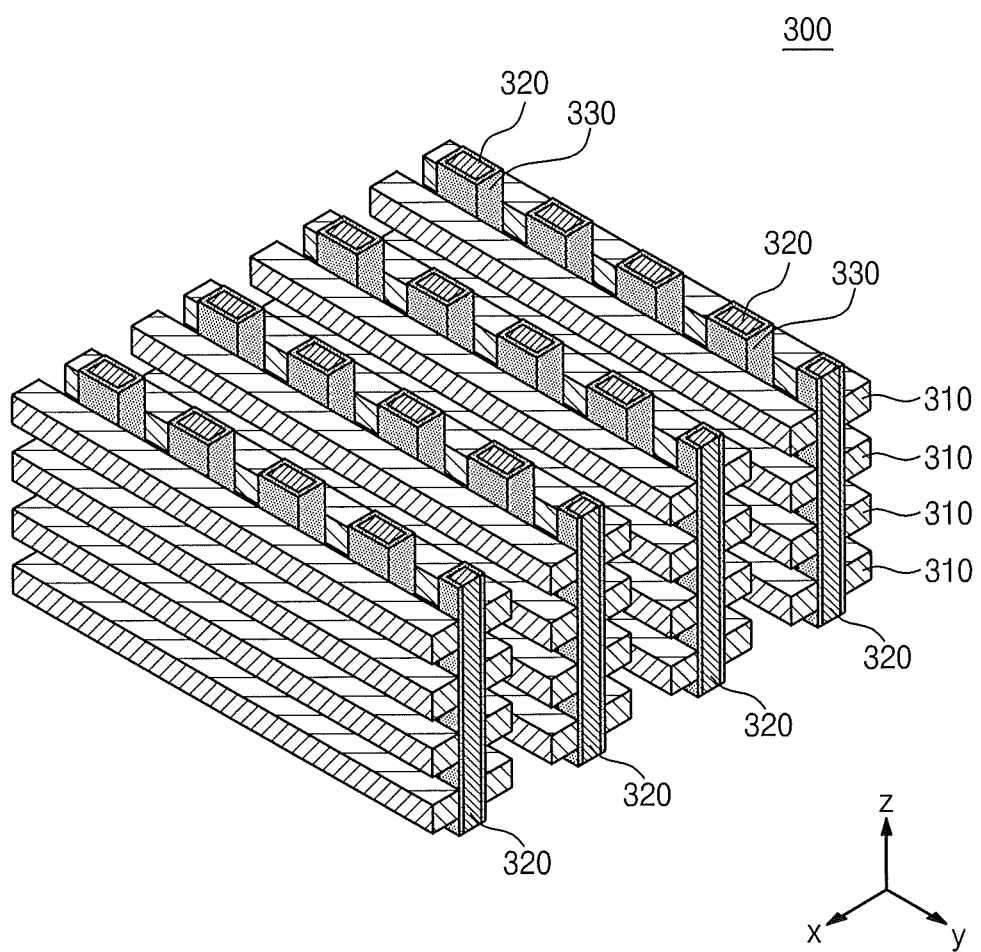
Figure 11:
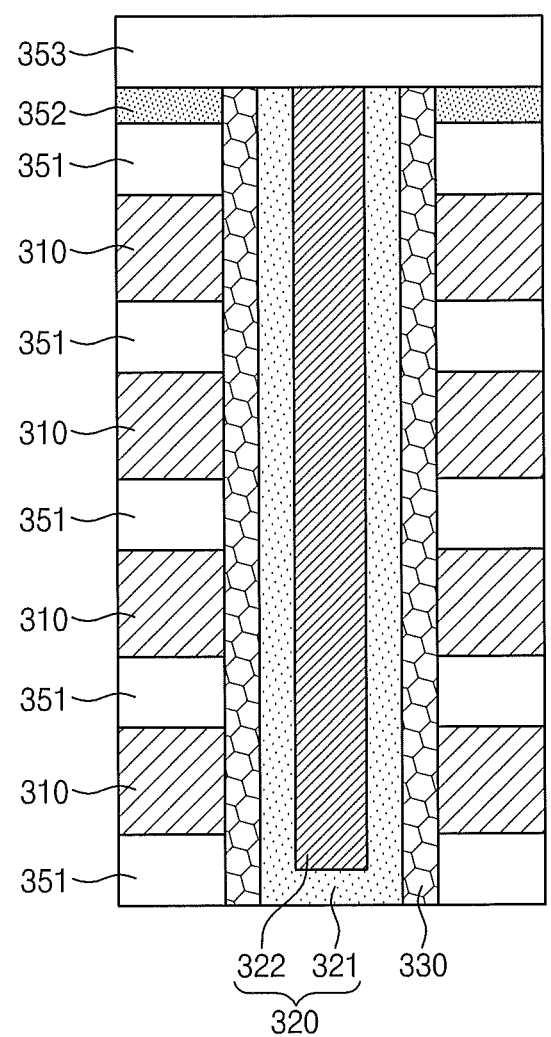
Figure 12:
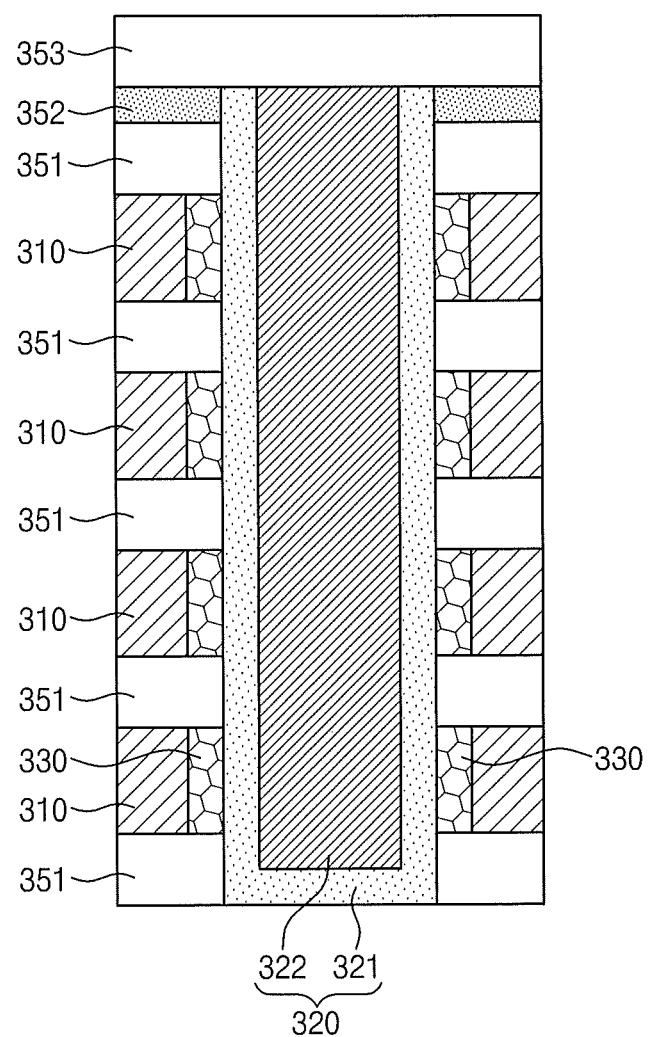
Figure 13:
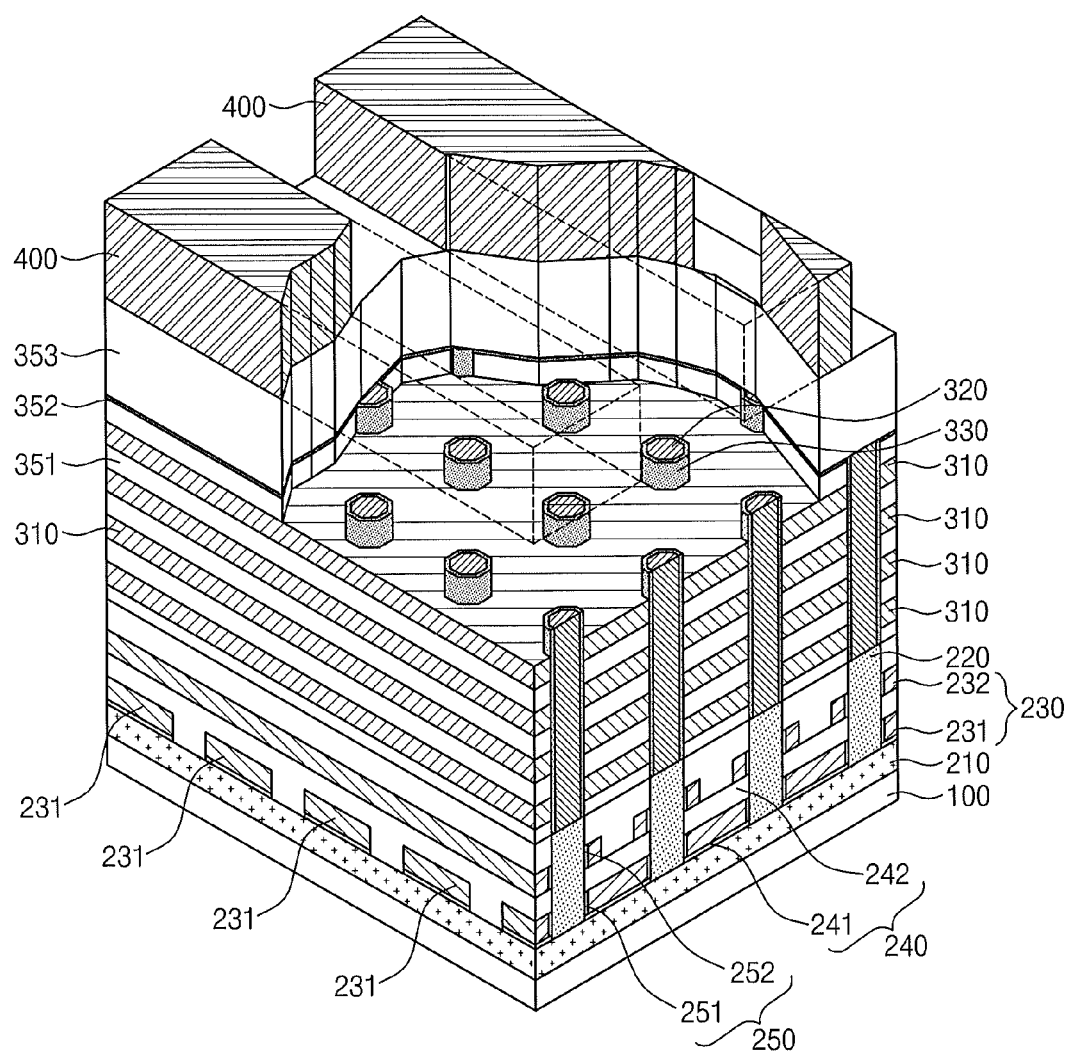
Figure 14:
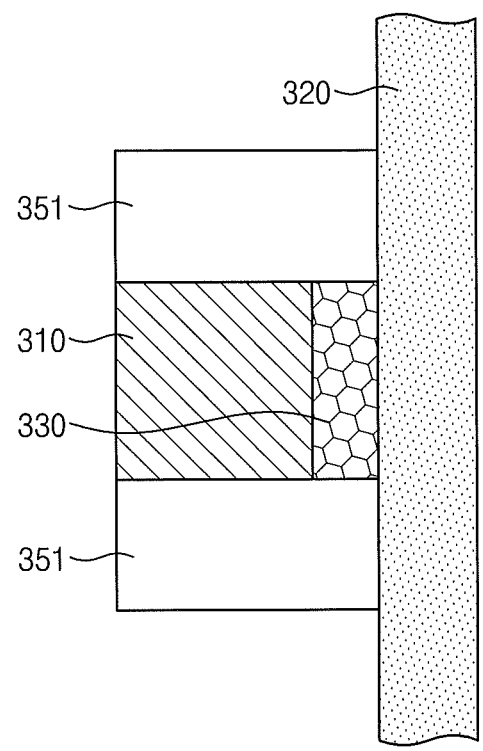
Figure 15:
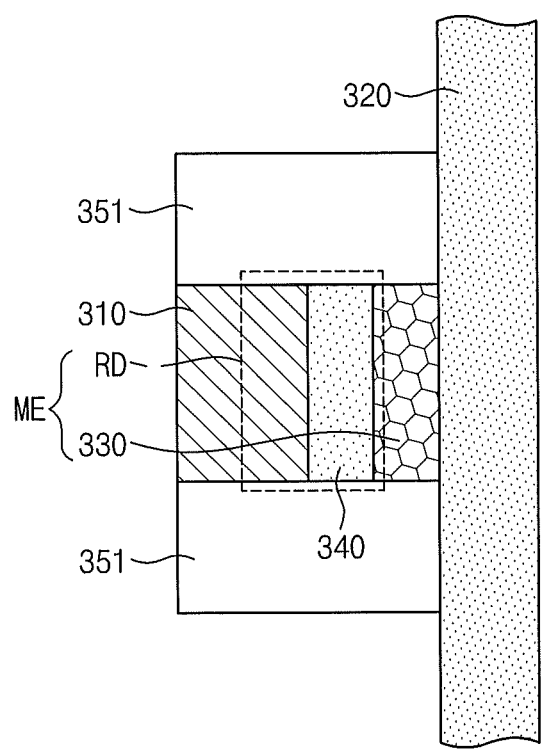

FIGS. 6 through 8 are perspective views exemplarily illustrating memory structures according to example embodiments of the inventive subject matter, and FIGS. 9 through 12 are sectional views of the memory structures according to example embodiments of the inventive subject matter. FIG. 13 is a perspective view illustrating some aspects of the memory structures according to example embodiments of the inventive subject matter, and FIGS. 14 and 15 are sectional views exemplarily illustrating unit cell structures according to example embodiments of the inventive subject matter.

Referring to FIGS. 6 through 8, the memory structure 300 may include a plurality of horizontal electrodes 310, parallel to the x-y plane and are stacked on the lower structure 100, and a plurality of vertical electrodes 320 intersecting the horizontal electrodes 310 along a direction orthogonal to the x-y plane. In addition, the memory structure 300 may further include information storing patterns 330 interposed between sidewalls of the horizontal electrodes 310 and the vertical electrodes 320.

In example embodiments, as shown in FIG. 6, the horizontal electrodes 310 may have a plate shape. For example, in a plan view, the areas of the horizontal electrodes 310 may be ten or more times greater than the cross-sectional areas of the semiconductor pillars 220, and each of the horizontal electrodes 310 may have a plurality of holes therethrough. The vertical electrodes 320 pass through the holes of the horizontal electrodes 310, and each of the vertical electrodes 320 may be connected to the corresponding one of the semiconductor pillars 220 of the selection structure 200.

In other embodiments, as shown in FIG. 7, the horizontal electrodes 310 may have a line shape crossing the vertical electrodes 320. For example, a length of each horizontal electrode 310 may be ten times or greater than a width of each semiconductor pillar 220 and a width of each horizontal electrode 310 may be smaller than three times a width of each semiconductor pillar 220. Each of the horizontal electrodes 310 may have a plurality of holes therethrough and the vertical electrodes 320 may vertically penetrate the holes of the horizontal electrodes 310 disposed at different levels. Similar to the case of FIG. 6, each of the vertical electrodes 320 may be connected to the corresponding one of the semiconductor pillars 220 of the selection structure 200.

In still other embodiments, as shown in FIG. 8, the horizontal electrodes 310 may have a line shape crossing the vertical electrodes 320. For example, the vertical electrodes 320 may be horizontally separated from each other at least in a region including a plurality of the one-dimensionally arranged vertical electrodes 320.

For example, a pair of the horizontal electrodes 310 disposed at both sides of each of the vertical electrodes 320 may be horizontally separated from each other to be able to have different electric potential form each other. In example embodiments, although not depicted in the drawings, one of the pair of horizontal electrodes 310 may be connected to an external circuit via a left-end portion thereof, while the other may be connected to other external circuit via a right-end portion thereof.

In other embodiments, a pair of the horizontal electrodes 310, which are disposed at both sides of each vertical electrode 320, may be electrically connected to each other to be in an equipotential state. For example, each of the vertical electrodes 320 may be formed to define at least one hole penetrating the same, but unlike the afore-described embodiments described with reference to FIGS. 6 and 7, a plurality of the vertical electrodes 320 may be provided through each of the holes.

Referring to FIGS. 9 through 12, interlayer dielectrics 351 may be provided between the vertically stacked horizontal electrodes 310, and thus, the horizontal electrodes 310 may be electrically separated from each other. In example embodiments, a capping layer 352 may be provided on the uppermost one of the horizontal electrodes 310. The capping layer 352 may be formed of a material having an etch selectivity with respect to the vertical electrodes 320, and thus, the capping layer 352 may serve as an etch stop layer during a node separation process of horizontally separating the vertical electrodes 320 or the information storing patterns 330. In addition, an upper insulating layer 353 may be provided to cover top surfaces of the vertical electrodes 320.

Figure 9:
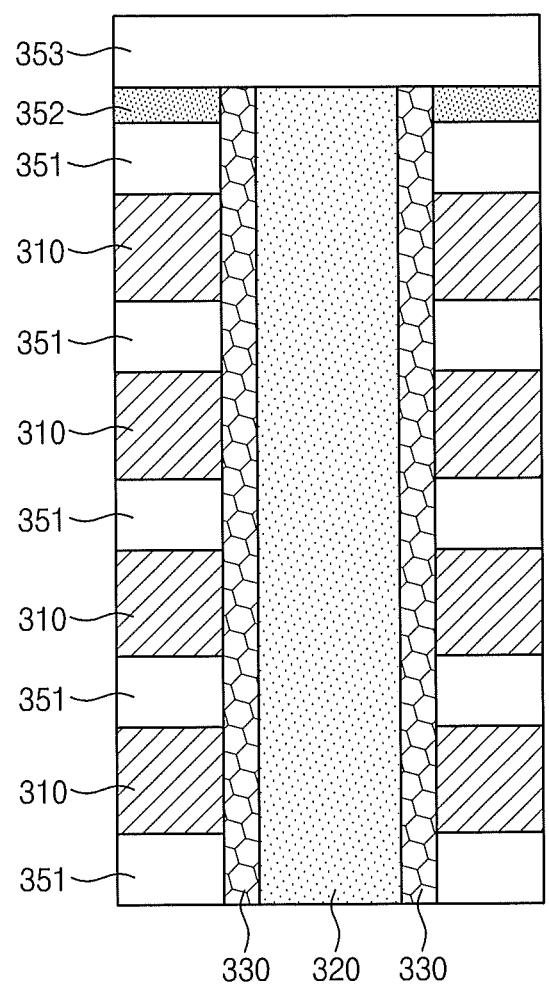

Each of the vertical electrodes 320 may include one or more conductive materials, such as doped semiconductor, metal, conductive metal nitride, silicide, and/or nanostructures (e.g., carbon nanotubes or graphene). In example embodiments, the vertical electrodes 320 may be formed from at least one of the afore-mentioned conductive materials. For example, each of the vertical electrodes 320 may be a single conductive pattern having a solid cylindrical structure and having a substantially rectangular vertical section, as shown in FIG. 9.

Figure 10:
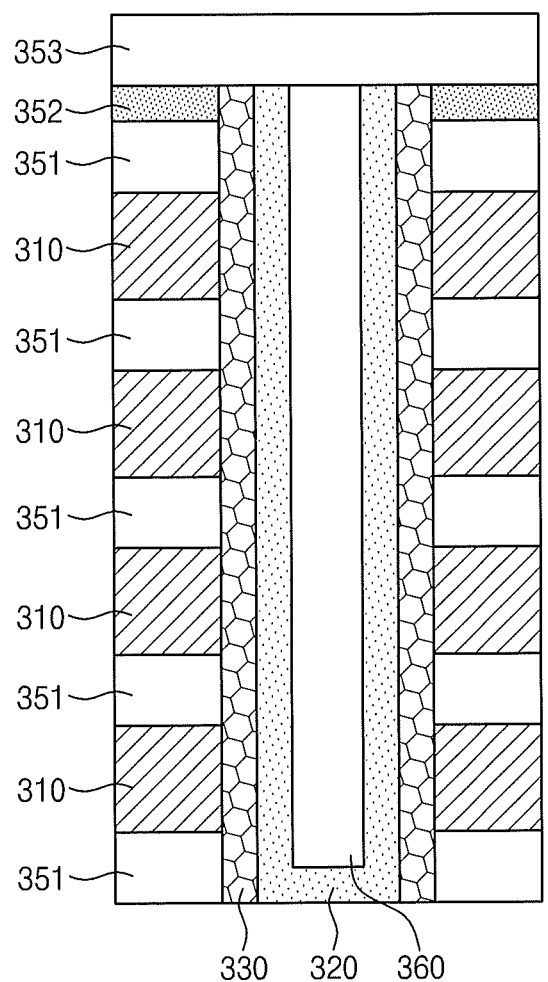

In some embodiments, each of the vertical electrodes 320 may be a single conductive pattern having a cup structure and having a "U"-shaped vertical section, as shown in FIG. 10. In the case in which the vertical electrode 320 has a cup structure, as shown in FIG. 10, an insulating gap-fill layer 360 may be provided to fill an internal space of the vertical electrode 320.

In some embodiments, each of the vertical electrodes 320 may be formed of at least two of the afore-mentioned conductive materials. For example, as shown in FIGS. 11 and 12, the vertical electrode 320 may include a first vertical electrode 321 shaped like a cup and a second vertical electrode 322 filling an internal space of the first vertical electrode 321 and having a solid cylindrical structure. The second vertical electrode 322 may be formed of a material, whose resistivity is lower than or substantially equivalent to the first vertical electrode 321. For example, the first vertical electrode 321 may be formed of a doped polysilicon layer, and the second vertical electrode 322 may be formed of a metal layer or a polysilicon layer, which is highly doped with impurities having the same conductivity type as the first vertical electrode 321.

Each of the information storing patterns 330 may be formed to cover an outer sidewall of the corresponding one of the vertical electrodes 320. For example, as shown in FIGS. 9 through 11, each of the information storing patterns 330 may be formed to penetrate the plurality of the vertically stacked horizontal electrodes 310. Accordingly, each of the information storing patterns 330 may be connected to a plurality of the horizontal electrodes 310 via an inner wall of the hole or inner sidewalls of the horizontal electrodes 310. In each of the information storing patterns 330, portions adjacent to the horizontal electrodes 310 may be used as memory elements. For example, each of the information storing patterns 330 shown in FIGS. 9 through 11 may include a plurality of vertically stacked memory elements.

In other embodiments, as shown in FIG. 12, each of the vertical electrodes 320 may be in contact with a plurality of the information storing patterns 330 separated vertically from each other by the interlayer dielectrics 351. For example, the interlayer dielectrics 351 may be in direct contact with outer sidewalls of the vertical electrodes 320 through spaces between the information storing patterns 330 vertically separated from each other, and each of the information storing patterns 330 may be provided between the interlayer dielectrics 351 to be in contact with an inner sidewall of the corresponding one of the horizontal electrodes 310. According to the example embodiments shown in FIG. 12, each of the information storing patterns 330 may serve as one of the three-dimensionally arranged memory elements.

In example embodiments, the upper insulating layer 353 may be formed to cover entire top surfaces of the vertical electrodes 320. Accordingly, the top surfaces of the vertical electrodes 320 may not be used as a pathway for delivering an electrical signal. For example, as shown in FIG. 13, interconnection lines 400 may be provided over the vertical electrodes 320, but the vertical electrodes 320 may not be directly connected to the interconnection lines 400 due to the presence of the upper insulating layer 353. Embodiments of the inventive subject matter are not limited thereto.

In other embodiments, as will be described with reference to FIGS. 25 through 27, structures of the vertical electrodes 320 and the information storing patterns 330 may be deformed to achieve stable electric connection between the vertical electrodes 320 and the semiconductor pillars 220.

The information storing pattern 330 may include at least one data-storing material. For example, the information storing pattern 330 may include one or more variable resistance materials having electric resistance that may be selectively changed by an electric current flowing through the information storing pattern 330.

In example embodiments, the information storing pattern 330 may include at least one material (e.g., chalcogenides) having an electric resistance that may be changed using thermal energy generated by an electric current flowing through the information storing pattern 330. The chalcogenides may include, for example, antimony (Sb), tellurium (Te), and/or selenium (Se). For example, the information storing pattern 330 may include a chalcogenide including tellurium (Te) at about 20 to about 80 atomic percent concentration, antimony (Sb) at about 5 to about 50 atomic percent concentration, and germanium (Ge) having the remaining concentration. In addition, the chalcogenide for the information storing pattern 330 may further include impurities including, for example, N, O, C, Bi, In, B, Sn, Si, Ti, Al, Ni, Fe, Dy, and/or La. In example embodiments, the information storing pattern 330 may include GeBiTe, InSb, GeSb, and/or GaSb.

In example embodiments, the information storing pattern 330 may be configured to have a layered structure with an electric resistance that may be changed using a spin transferring phenomenon of an electric current flowing through the information storing pattern 330. For example, the information storing pattern 330 may be configured to have a layered structure exhibiting a magneto-resistance property and include at least one ferromagnetic material and/or at least one antiferromagnetic material.

In example embodiments, the information storing pattern 330 may include perovskite compounds and/or transition metal oxides. For example, the information storing pattern 330 may include niobium oxide, titanium oxide, nickel oxide, zirconium oxide, vanadium oxide, PCMO((Pr,Ca)MnO3), strontium-titanium oxide, barium-strontium-titanium oxide, strontium-zirconium oxide, barium-zirconium oxide, and/or barium-strontium-zirconium oxide.

Furthermore, in example embodiments, the information storing pattern 330 may include one or more materials that exhibit a self-rectifying property and/or a nonlinear electric current-voltage property at an interface with the horizontal electrode 310 or the vertical electrode 320, in addition to the data-storing property. For example, the information storing pattern 330 may include at one or more transition metal oxides and the horizontal electrode 310 or the vertical electrode 320 may include one or more metals and/or metal nitrides. In example embodiments, the transition metal oxides for the information storing pattern 330 may include hafnium oxide and/or tantalum oxide, the horizontal or vertical electrode 310 or 320 may include a titanium nitride layer, a composite and/or a double-layered structure of zirconium and titanium nitride, and/or a composite or multi-layered structure of zirconium/ruthenium/titanium nitride. For example, the horizontal electrode 310, the information storing pattern 330, and the vertical electrode 320 may be configured to have a multi-layered structure of TiN/HfOx/TiN, TiN/TaOx/TiN, TiN/TaOx/Zr/TiN or TiN/TaOx/Zr/Ru/TiN.

In the case in which the horizontal electrode 310 is formed of a metallic material, the information storing pattern 330 may provide a schottky junction along with the horizontal electrode 310, and the memory element ME may be provided as a structure including the information storing pattern 330, as shown in FIGS. 9 through 12 and 14. In some embodiments, an intermediate pattern 340 may be additionally provided between the information storing pattern 330 and the horizontal electrode 310, as shown in FIG. 15, to provide a schottky junction serving as rectifying device RD, along with the horizontal electrode 310. In example embodiments, the intermediate pattern 340 may be formed from a reaction between the information storing pattern 330 and the horizontal electrode 310, and have different chemical composition from the information storing pattern 330.

Embodiments of the inventive subject matter are not limited thereto. For example, as shown in FIG. 15, each of the memory elements ME may further include two-terminal rectifying devices RD interposed between the horizontal electrode 310 and the information storing pattern 330, in addition to the information storing pattern 330. The rectifying device RD may be, for example, realized by an intermediate pattern 340, which may be interposed between the horizontal electrode 310 and the information storing pattern 330 and be different from the horizontal electrode 310 in terms of conductivity type or work function. In the case in which the horizontal electrode 310 is formed of semiconductor, the horizontal electrode 310 and the intermediate pattern 340 may provide a PN diode. If the horizontal electrode 310 is formed of a metallic material, the horizontal electrode 310 and the intermediate pattern 340 may provide a schottky diode. Although not depicted in the drawings, the rectifying device RD may be interposed between the vertical electrode 320 and the information storing pattern 330.

Figure 16:
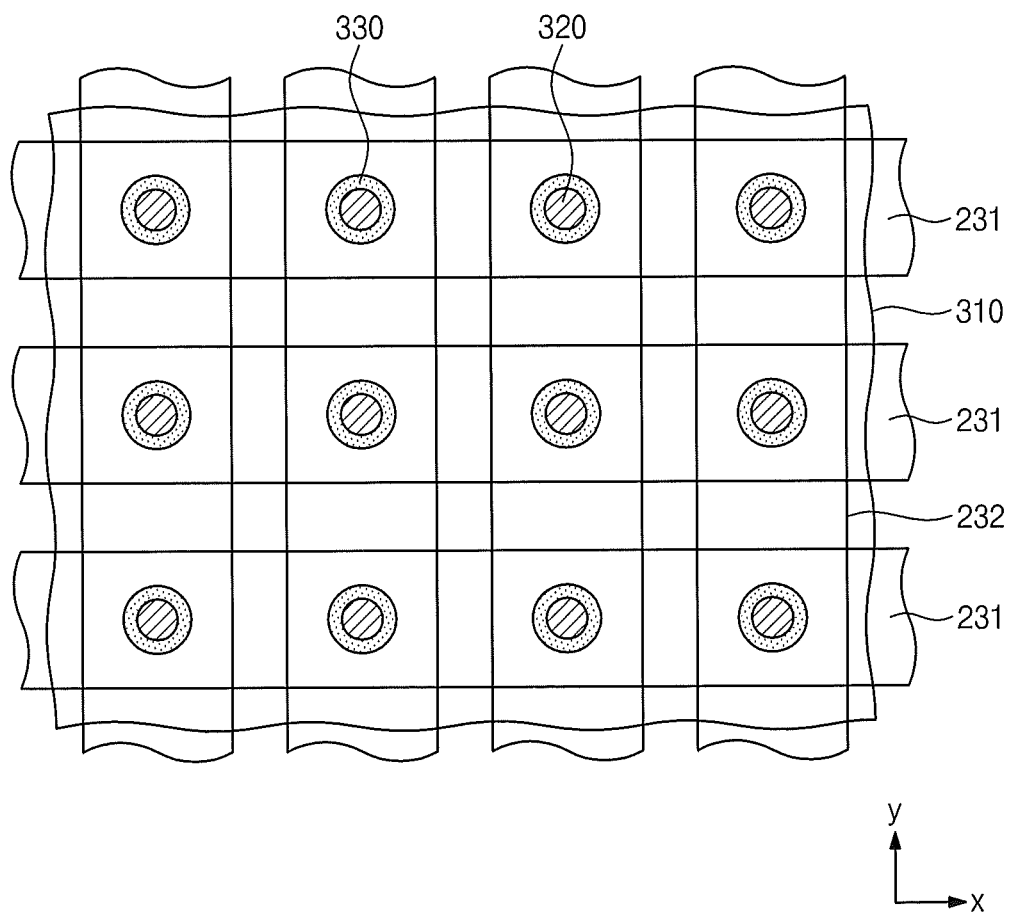
Figure 17:
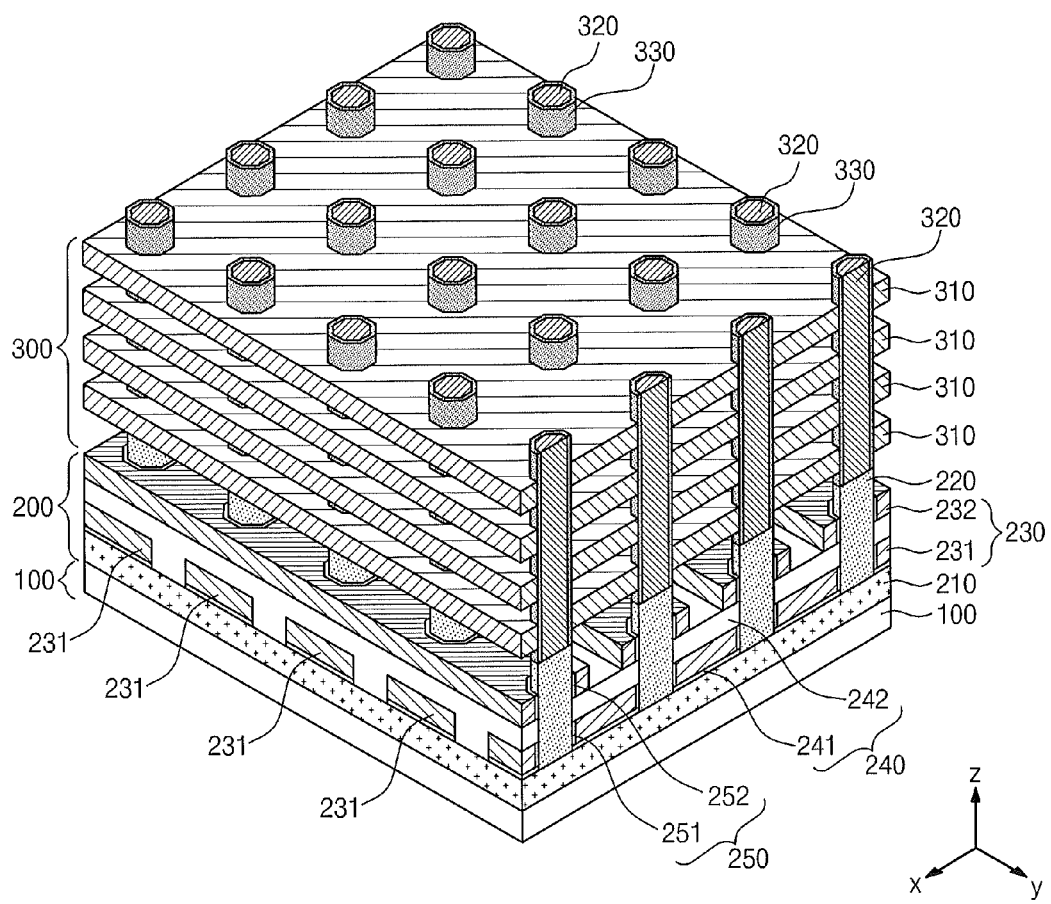
Figure 18:
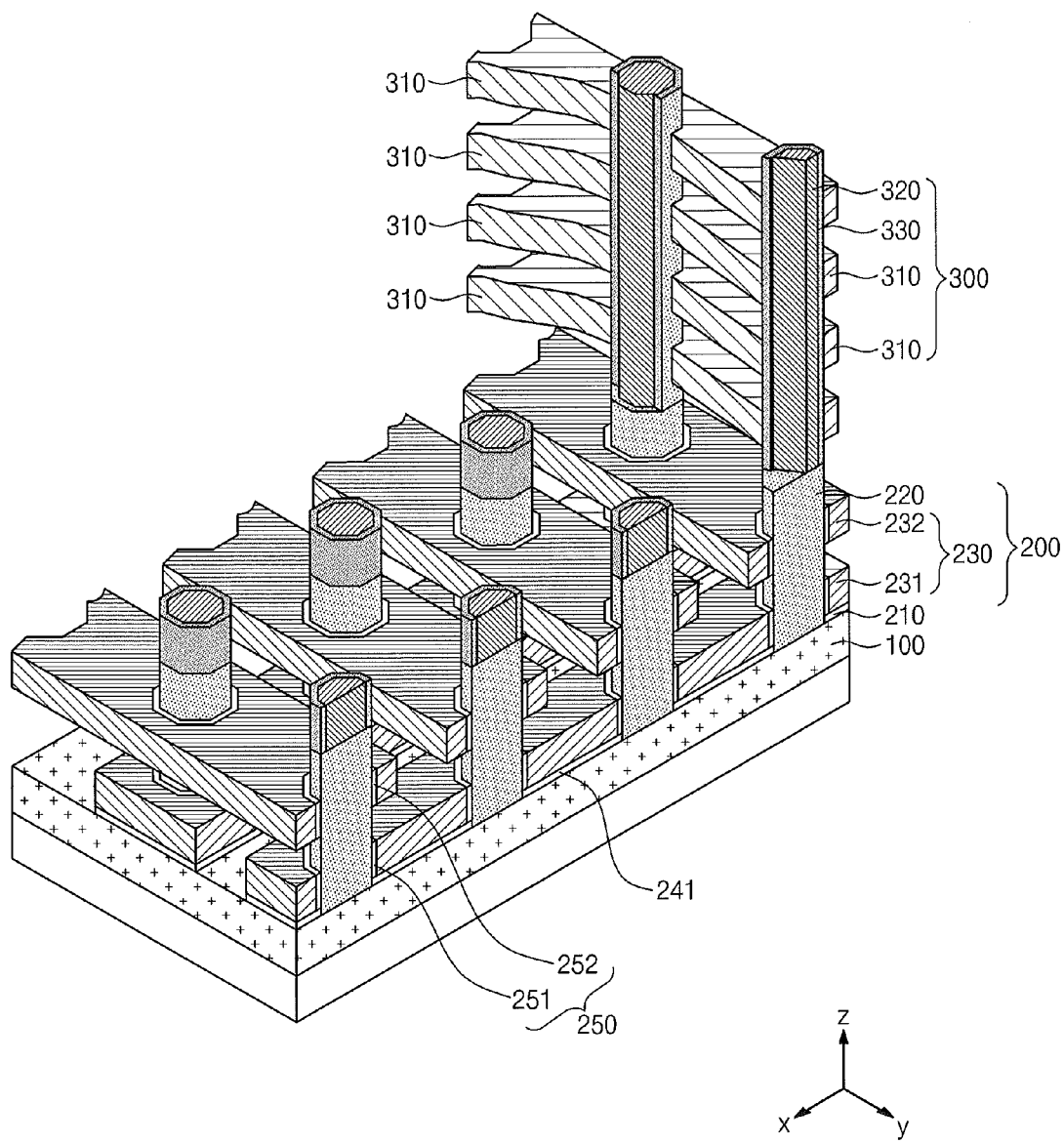

FIG. 16 is a plan view illustrating some examples of the cell array region of the semiconductor memory device, and FIGS. 17 and 18 are perspective views illustrating examples of the cell array region of FIG. 16. For the sake of brevity, the elements and features of this example that are similar to those previously shown and described will not be described in much further detail.

Referring to FIGS. 16 through 18, the selection structure 200 may be provided as a structure including the conductive region 210, which may be shaped like a plate, and the first and second selection lines 231 and 232, which may be spaced vertically apart from each other and cross with each other. The memory structure 300 may be provided as a structure including the horizontal electrodes 310 shaped like a plate, as shown in FIG. 15. For example, as shown in FIGS. 17 and 18, the selection structure 200 and the memory structure 300 may be configured to have the substantially same structures as those described with reference to FIGS. 2 and 6, respectively, and the semiconductor pillars 220 of the selection structure 200 may be connected to the vertical electrodes 320 of the memory structure 300, respectively.

Figure 19:
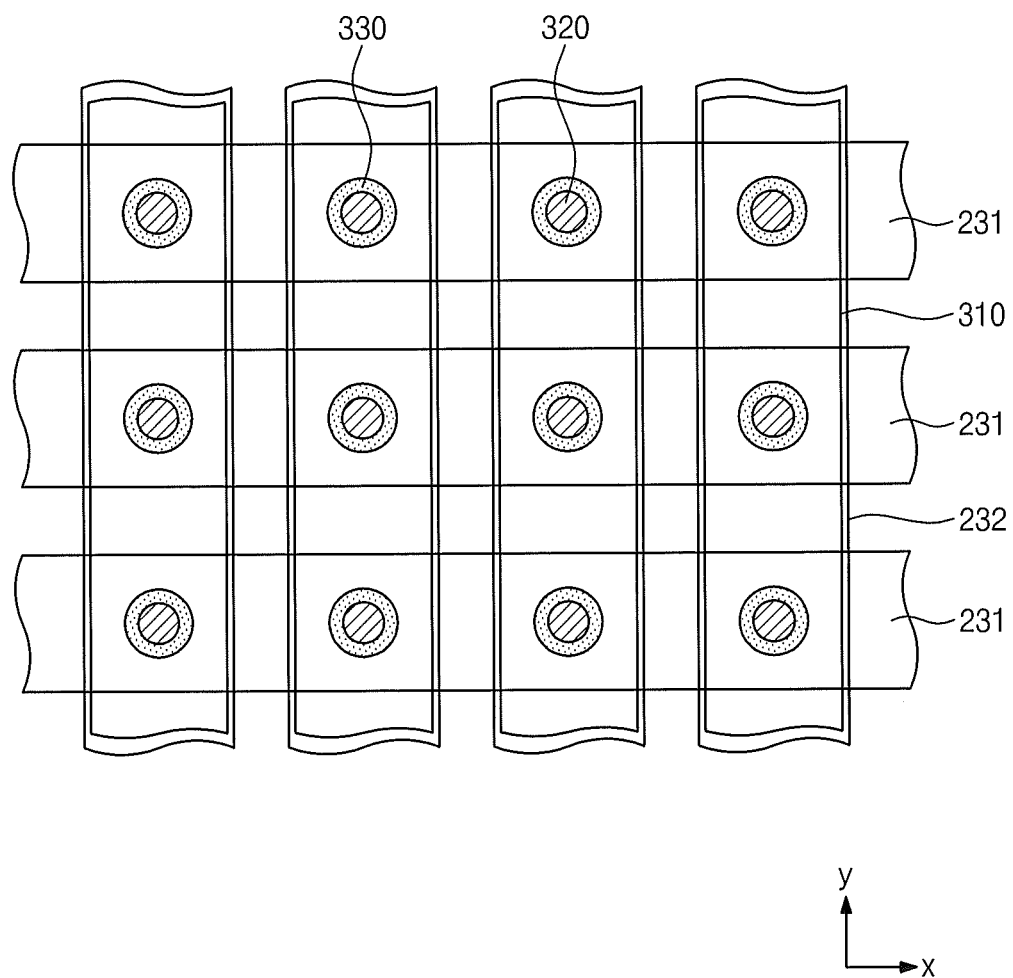
Figure 20:
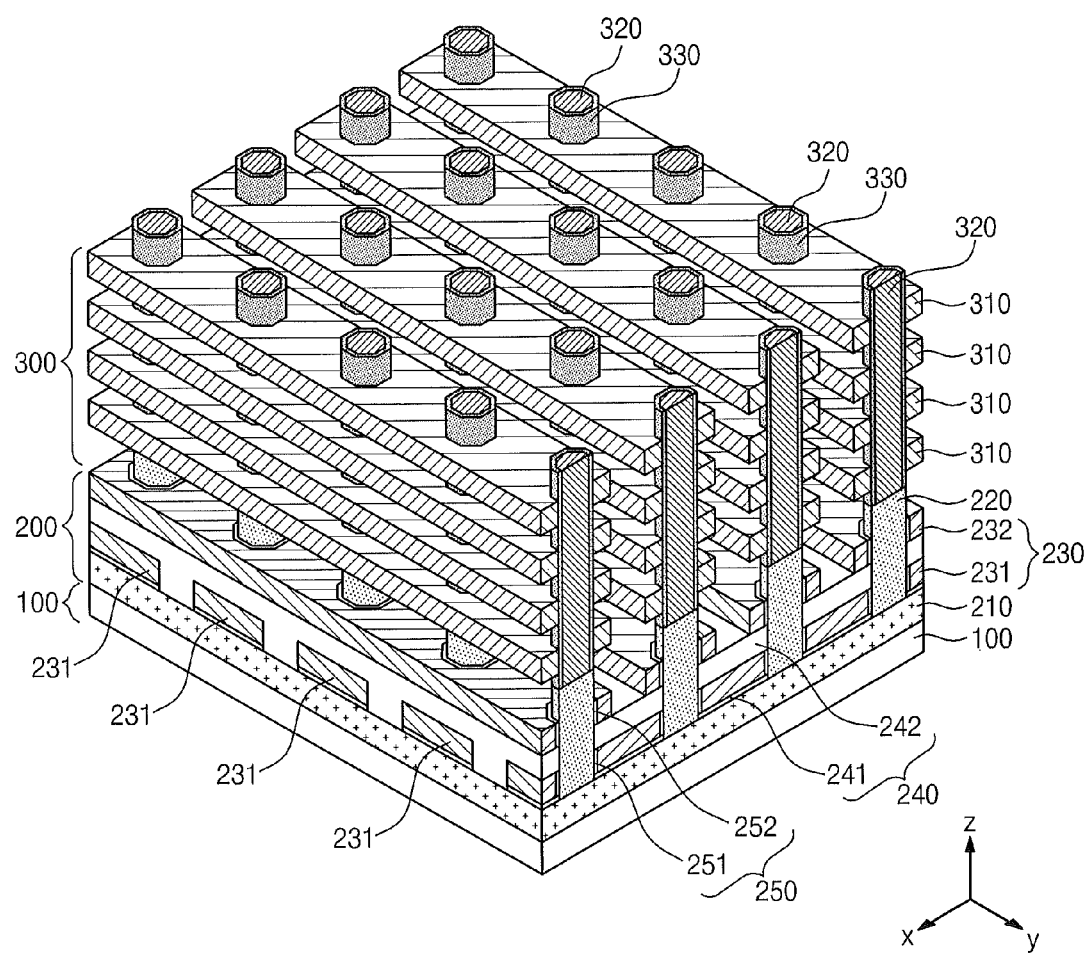

FIGS. 19 and 20 are plan and perspective views illustrating other examples of the cell array region of the semiconductor memory device. For the sake of brevity, the elements and features of this example that are similar to those previously shown and described will not be described in much further detail.

Referring to FIGS. 19 and 20, according to the present example embodiments, the selection structure 200 may be provided as a structure including the conductive region 210, which may be shaped like a plate, and the first and second selection lines 231 and 232, which may be spaced vertically apart from each other and cross with each other, and the memory structure 300 may be provided as a structure including the horizontal electrodes 310 shaped like a line, as shown in FIG. 19. For example, as shown in FIG. 20, the selection structure 200 and the memory structure 300 may be configured to have the substantially same structures as those described with reference to FIGS. 2 and 7, respectively, and the semiconductor pillars 220 of the selection structure 200 may be connected to the vertical electrodes 320 of the memory structure 300, respectively.

Figure 21:
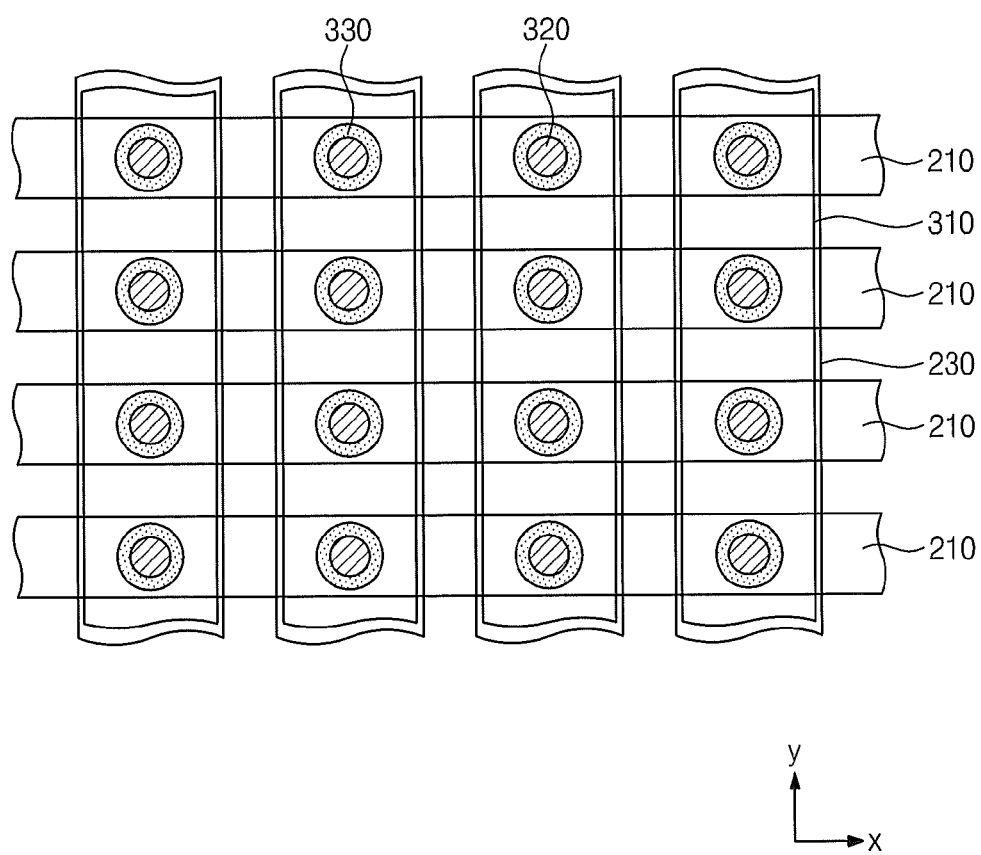
Figure 22:
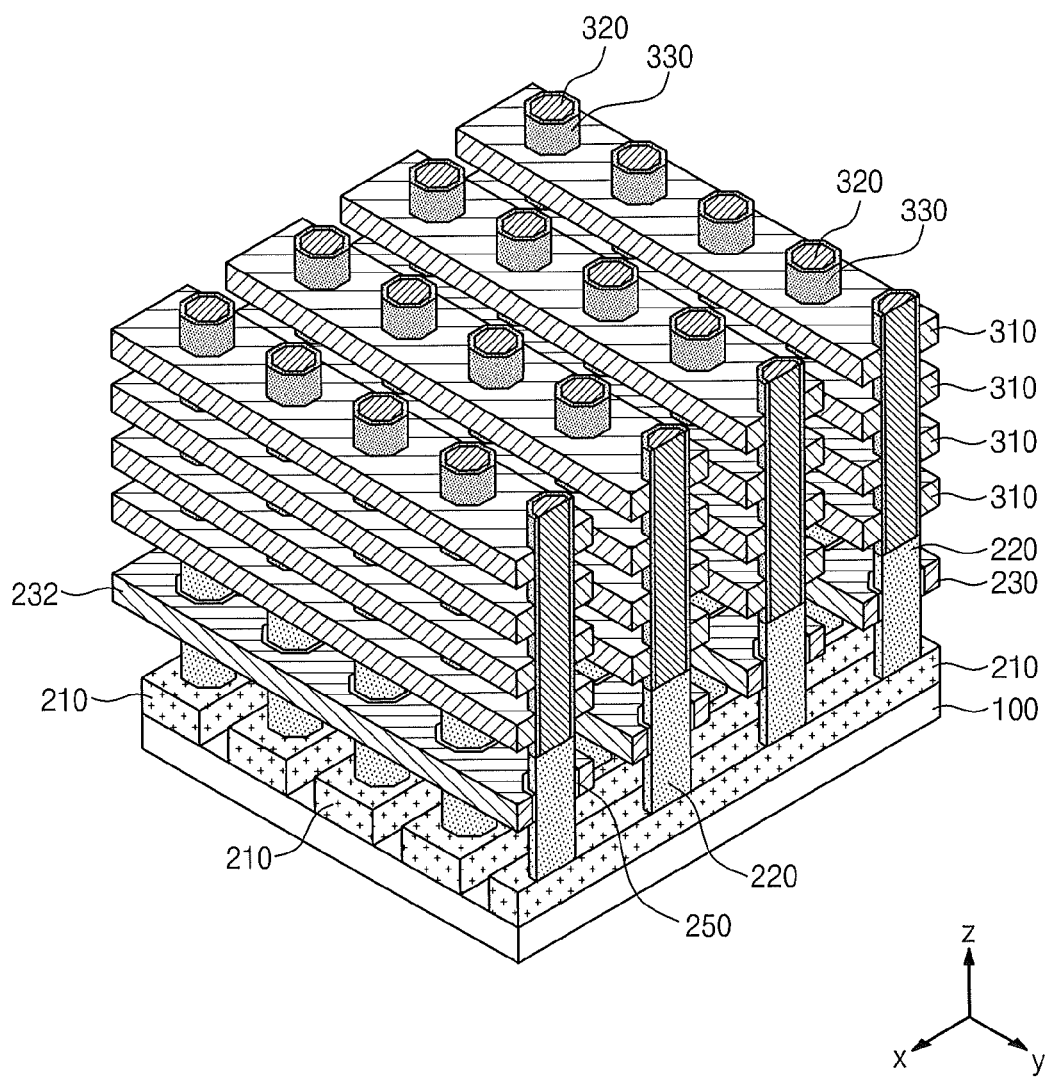

FIGS. 21 and 22 are plan and perspective views illustrating still other examples of the cell array region of the semiconductor memory device. For the sake of brevity, the elements and features of this example that are similar to those previously shown and described will not be described in much further detail.

Referring to FIGS. 21 and 22, according to the present example embodiments, the selection structure 200 may be provided as a structure including the common source lines 210 spaced horizontally apart from each other and the selection lines 230 crossing the common source lines 210, and the memory structure 300 may be provided as a structure including the horizontal electrodes 310 shaped like a line as shown in FIG. 21. For example, as shown in FIG. 22, the selection structure 200 and the memory structure 300 may be configured to have the substantially same structures as those described with reference to FIGS. 5 and 7, respectively, and the semiconductor pillars 220 of the selection structure 200 may be connected to the vertical electrodes 320 of the memory structure 300, respectively. In example embodiments, the horizontal electrodes 310 may be arranged to be parallel to the selection lines 230.

Figure 23:
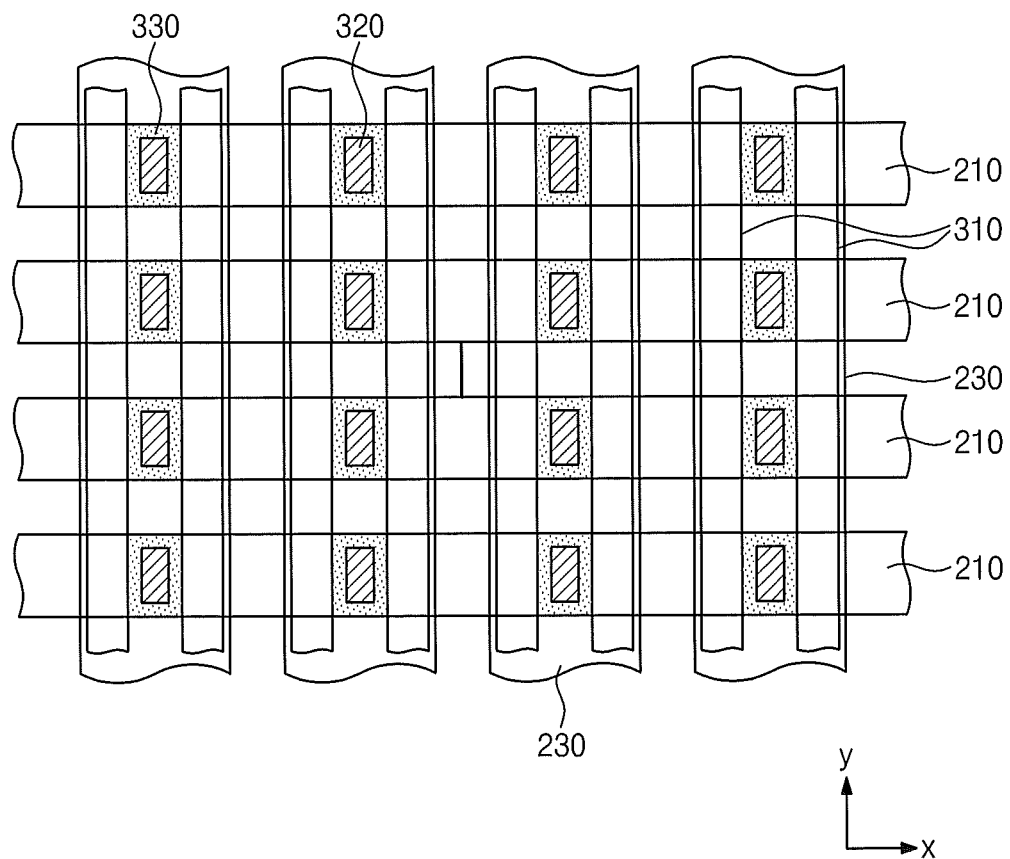
Figure 24:
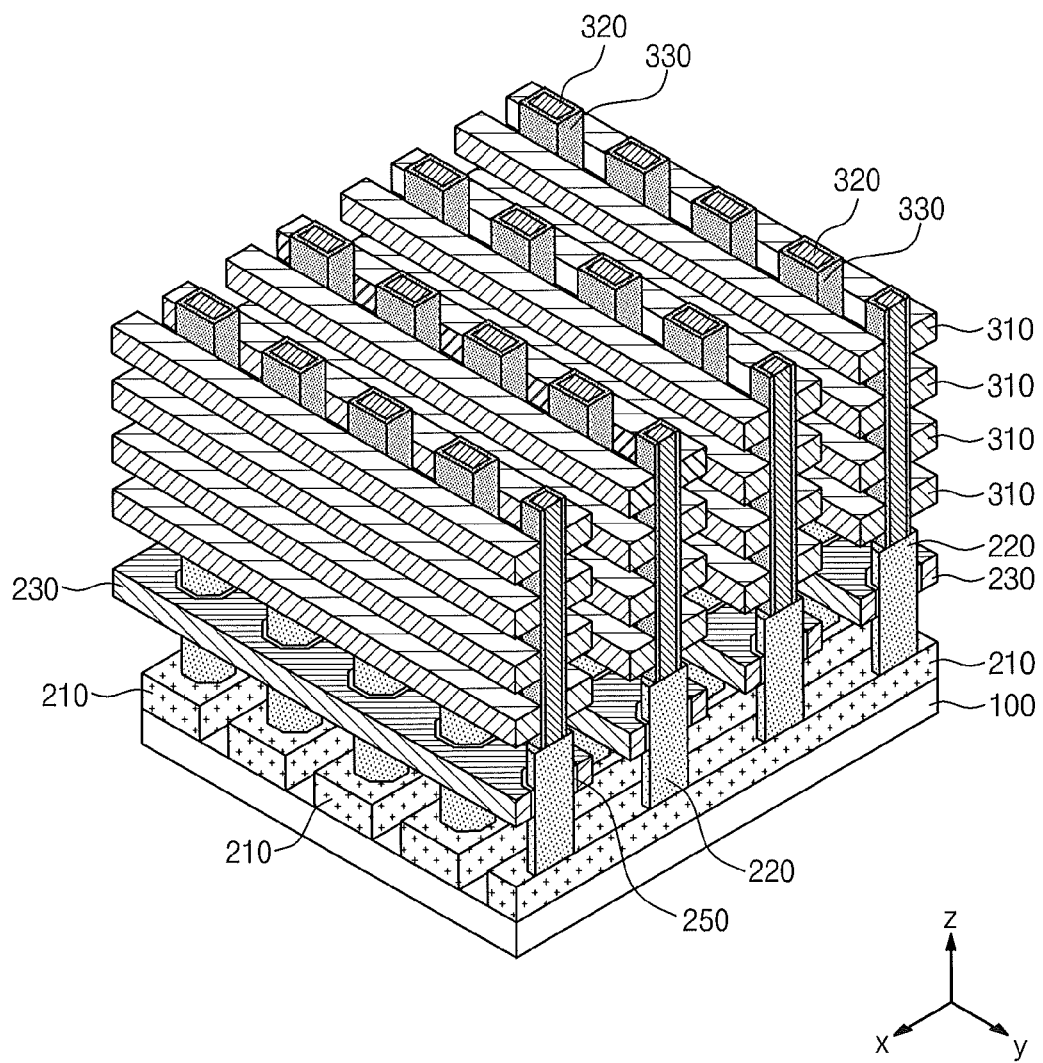

FIGS. 23 and 24 are plan and perspective views illustrating yet other examples of the cell array region of the semiconductor memory device. For the sake of brevity, the elements and features of this example that are similar to those previously shown and described will not be described in much further detail.

Referring to FIGS. 23 and 24, according to the present example embodiments, the selection structure 200 may be provided as a structure including the common source lines 210 spaced horizontally apart from each other and the selection lines 230 crossing the common source lines 210, and the memory structure 300 may be provided as a structure including the horizontal electrodes 310 shaped like a line. According to the present example embodiments, a pair of the horizontal electrodes 310, disposed at both sides of each vertical electrode 320, may be horizontally separated from each other. For example, as shown in FIG. 23, the selection structure 200 and the memory structure 300 may be configured to have the substantially same structures as those described with reference to FIGS. 5 and 8, respectively, and the semiconductor pillars 220 of the selection structure 200 may be connected to the vertical electrodes 320 of the memory structure 300, respectively. In example embodiments, the horizontal electrodes 310 may be arranged to be parallel to the selection lines 230.

Figure 25:
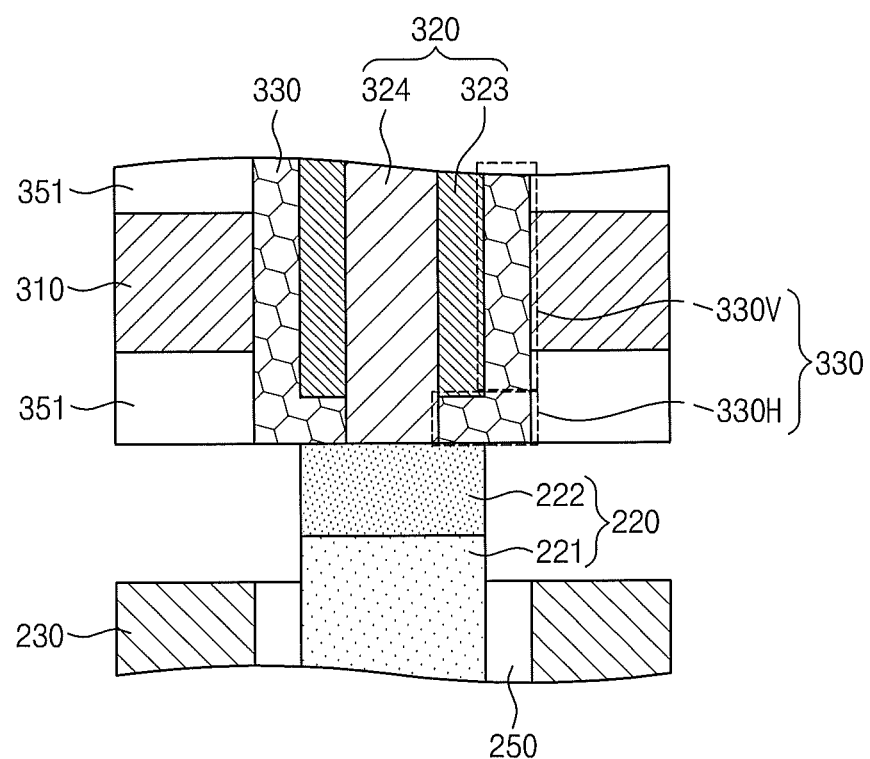
Figure 26:
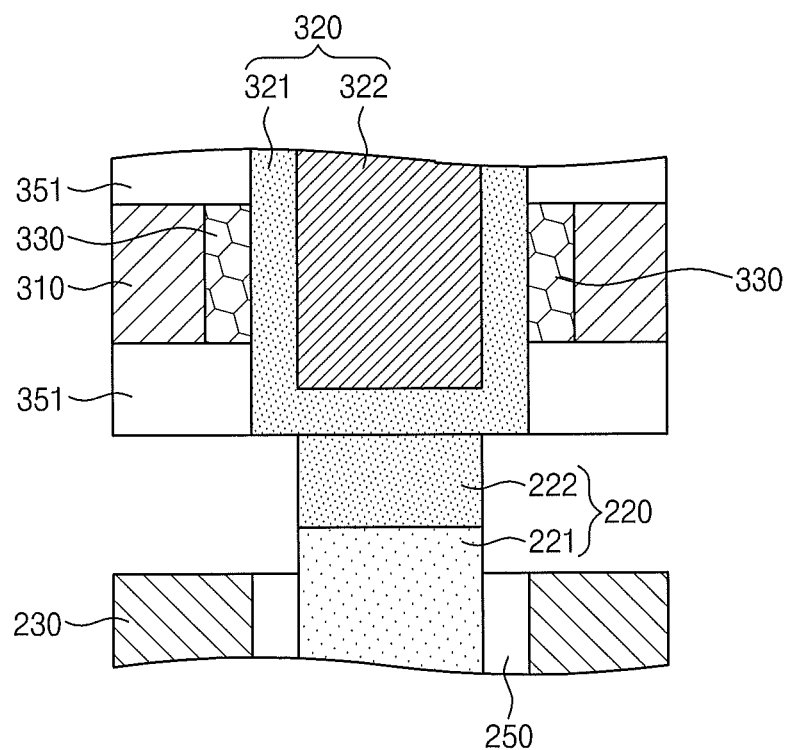
Figure 27:
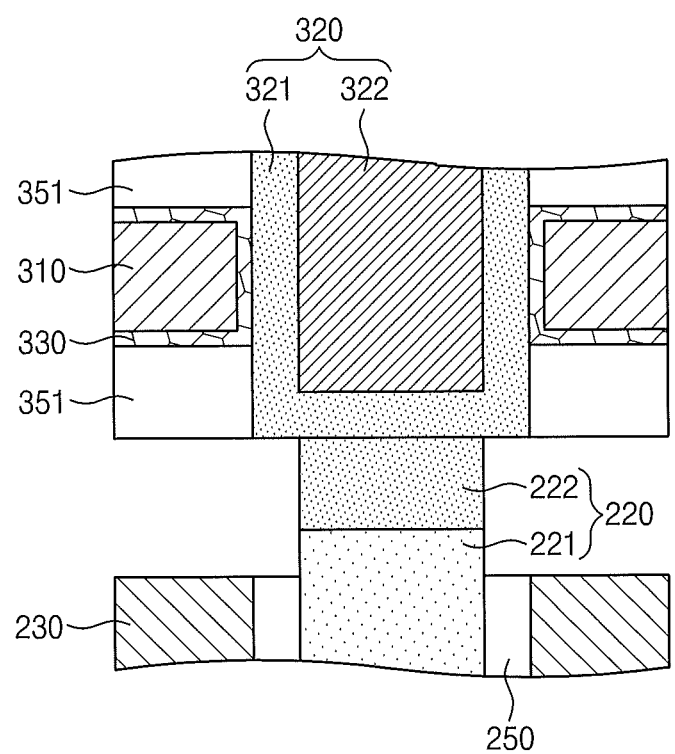

FIGS. 25 through 27 are sectional views exemplarily illustrating connection structures between the memory structure and the selection structure according to example embodiments of the inventive subject matter.

Referring to FIG. 25, the vertical electrode 320 may include a third vertical electrode 323 shaped like a pipe and a fourth vertical electrode 324 filling an internal space of the third vertical electrode 323, and the information storing pattern 330 may include a vertical portion 330V covering an outer sidewall of the third vertical electrode 323 and a horizontal portion 330H extending from a bottom of the vertical portion 330V inward to cover a bottom surface of the third vertical electrode 323.

Due to the presence of the horizontal portion 330H, the bottom surface of the third vertical electrode 323 may be vertically spaced apart from the upper region 222 of the semiconductor pillar 220. The fourth vertical electrode 324 may have a bottom surface positioned at a level lower than the third vertical electrode 323, and thus, the fourth vertical electrode 324 may be in direct contact with the upper region 222 of the semiconductor pillar 220 through the horizontal portion 330H of the information storing pattern 330. In example embodiments, the horizontal portion 330H may be in direct contact with a lower sidewall of the fourth vertical electrode 324.

The third and fourth vertical electrodes 323 and 324 may be independently formed using different deposition processes from each other. For example, the third vertical electrode 323 may be formed by a spacer-forming process including deposition and anisotropic etching steps to expose the upper region 222 through the information storing pattern 330. By virtue of the presence of the third vertical electrode 323, it is possible to prevent the information storing pattern 330 from being damaged, when the etching process on the information storing pattern 330 may be performed to expose the upper region 222.

Referring to FIG. 26, the information storing pattern 330 may be formed to have the structure previously described with reference to FIG. 12. For example, the information storing pattern 330 may be localized on a sidewall of the horizontal electrode 310, and thus, the vertical electrode 320 may be directly connected to the upper region 222 of the semiconductor pillar 220, without any disconnection caused by the presence of the information storing pattern 330.

Referring to FIG. 27, the information storing pattern 330 may extend horizontally from between sidewalls of the horizontal electrode 310 and the vertical electrode 320 to cover top and bottom surfaces of the horizontal electrode 310. For example, the information storing pattern 330 may be formed to have a "U"-shaped vertical section. In example embodiments, the information storing pattern 330 may be localized in a region adjacent to the horizontal electrode 310, and thus, the vertical electrode 320 may be directly connected to the upper region 222 of the semiconductor pillar 220, without any disconnection caused by the presence of the information storing pattern 330.

Figure 28:
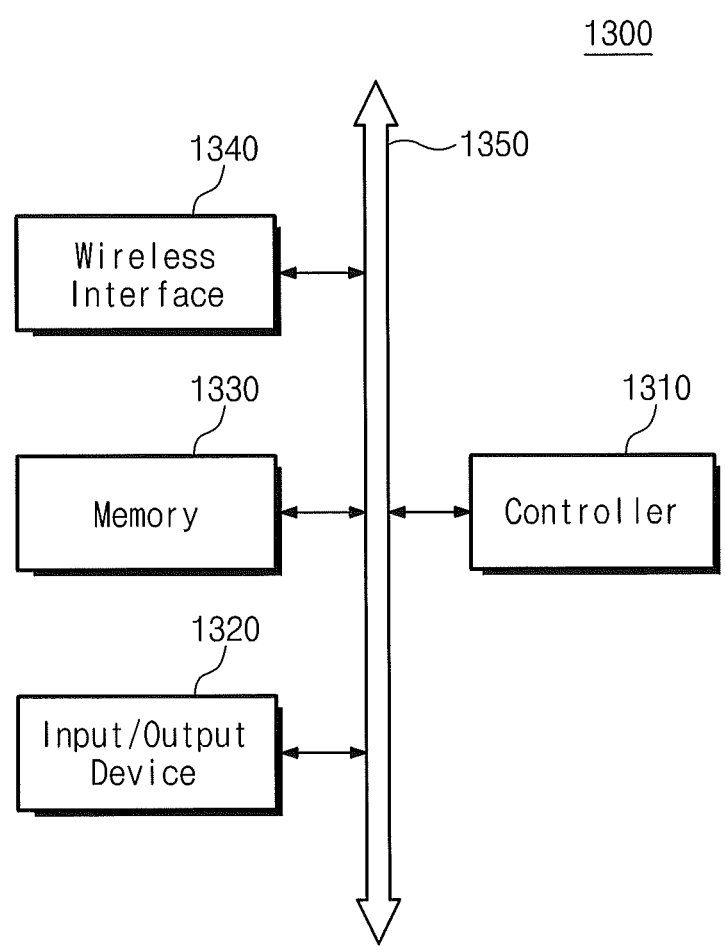
Figure 29:
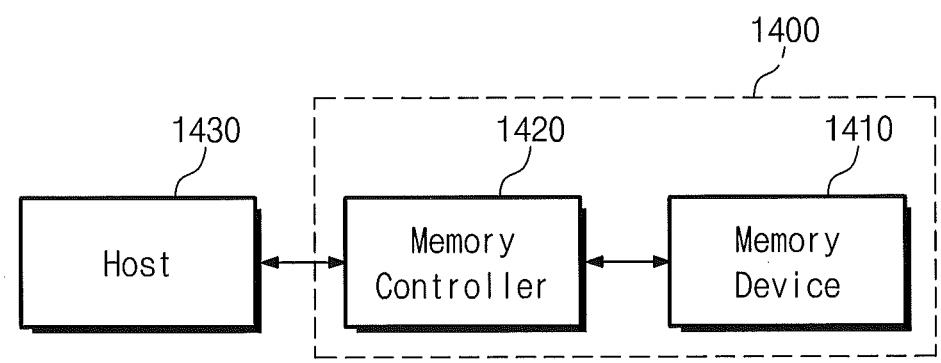

FIGS. 28 and 29 are block diagrams schematically illustrating electronic devices including a semiconductor device according to example embodiments of the inventive subject matter.

Referring to FIG. 28, an electronic device 1300 including a semiconductor device according to example embodiments of the inventive subject matter may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of the inventive subject matter. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 29, a memory system including a semiconductor device according to example embodiments of the inventive subject matter will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of the inventive subject matter.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

According to example embodiments of the inventive subject matter, a memory structure including two-dimensionally arranged vertical electrodes may be provided on a lower structure, and a selection structure, which is configured to be able to select one of the vertical electrodes, may be provided between the lower structure and the memory structure. The selection structure may include switching devices, and the switching devices may be realized using semiconductor pillars, each of which is disposed below the corresponding one of the vertical electrodes. As a result, it is possible to reduce an occupying area of the switching device, and this enables to increase memory capacity of the semiconductor memory device.

In addition, the memory structures may include three-dimensionally arranged memory cells, and thus, it is possible to increase the memory capacity of the semiconductor memory device according to example embodiments of the inventive subject matter, compared with the device including two-dimensionally arranged memory cells.

While example embodiments of the inventive subject matter have been particularly shown and described, it will be understood by one of ordinary skill in the art that variations in form and detail may be made therein without departing from the spirit and scope of the attached claims.

What is claimed is:

1. A memory device, comprising:
   a common conductive region;
   a plurality of spaced apart vertical semiconductor pillars electrically coupled to the common conductive region;
   at least one first horizontal selection line adjacent at least one sidewall of at least one of the semiconductor pillars at a first level above the common conductive region;
   at least one second horizontal selection line adjacent the at least one sidewall of the at least one of the semiconductor pillars at a second level above the common conductive region;
   a plurality of vertical electrodes, respective ones of which are disposed on and electrically coupled to respective ones of the semiconductor pillars;
   a plurality of horizontal electrodes stacked on the common conductive region and disposed adjacent sidewalls of the vertical electrodes; and
   variable-resistance memory elements interposed between the vertical and horizontal electrodes, wherein the variable-resistance memory elements are configured to provide rectification.

2. The device of claim 1, wherein each of the variable-resistance memory elements comprises:
   at least one variable resistance element; and
   at least one pattern interposed between at least one of the horizontal and vertical electrodes and the variable resistance element and configured to provide rectification.

3. A memory device, comprising:
   a common conductive region;
   a plurality of spaced apart vertical semiconductor pillars electrically coupled to the common conductive region;
   at least one first horizontal selection line adjacent at least one sidewall of at least one of the semiconductor pillars at a first level above the common conductive region;
   at least one second horizontal selection line adjacent the at least one sidewall of the at least one of the semiconductor pillars at a second level above the common conductive region;
   a plurality of vertical electrodes, respective ones of which are disposed on and electrically coupled to respective ones of the semiconductor pillars;
   a plurality of horizontal electrodes stacked on the common conductive region and disposed adjacent sidewalls of the vertical electrodes; and
   variable-resistance memory elements interposed between the vertical and horizontal electrodes, wherein each of the vertical electrodes comprises:
   a first conductive region adjoining an inner sidewall of each of the variable-resistance memory elements; and
   a second conductive region disposed within a space defined by the first conductive region,
   wherein a bottom surface of the second conductive region is closer to an underlying semiconductor pillar than a bottom surface of the first conductive region.

4. The device of claim 3, wherein the semiconductor pillars are two-dimensionally arranged on the common conductive region.

5. The device of claim 3, wherein the common conductive region has a width at least ten times greater than a width of each semiconductor pillar.

6. The device of claim 3, further comprising at least one dielectric region interposed between the sidewall of the at least one semiconductor pillar and the at least one first selection line and between the sidewall of the at least one semiconductor pillar and the at least one second selection line.

7. The device of claim 6, wherein the at least one first selection line differs from the at least one second selection line in thickness, impurity concentration, material, and/or width.

8. The device of claim 3, wherein the common conductive region comprises a doped semiconductor layer, wherein each of the semiconductor pillars comprises lower and upper regions adjacent the common conductive region and the vertical electrodes, respectively, and wherein the lower regions have a different conductivity type and/or a different impurity concentration than the common conductive region.

9. The device of claim 3, wherein each of the semiconductor pillars comprises lower and upper regions disposed adjacent the common conductive region and the vertical electrodes, respectively, wherein the at least one first selection line and the at least one second selection line face the lower region of the semiconductor pillar, wherein the lower regions have a different conductivity type than the common conductive region and wherein the upper regions have the same conductivity type as the common conductive region.

10. The device of claim 3, wherein the semiconductor pillars pass through the at least one first selection line and the at least one second selection line.

11. The device of claim 3, further comprising an insulating layer covering top surfaces of the vertical electrodes.

12. The device of claim 3, wherein the first conductive region is spaced apart from the underlying semiconductor pillar, and wherein the second conductive region is in direct contact with the underlying semiconductor pillar.

13. The device of claim 3, wherein each of the variable-resistance memory elements comprises an information storing pattern comprising a vertical portion disposed between one of the horizontal electrodes and the first conductive region and a horizontal portion extending from a bottom of the vertical portion inward to cover a bottom surface of the first conductive region such that the first conductive region is separated from the underlying semiconductor pillar by the horizontal portion.

14. The device of claim 3, further comprising interlayer dielectric regions interposed between adjacent ones of the horizontal electrodes, wherein the variable-resistance memory elements are vertically separated from one another by the interlayer dielectric regions, and wherein the interlayer dielectric regions are in direct contact with the vertical electrodes in spaces between the vertically separated memory elements.

15. The device of claim 3, wherein the vertical electrodes pass through the horizontal electrodes.

16. The device of claim 3, wherein the horizontal electrodes comprise respective horizontal plates and/or wherein the horizontal electrodes comprise respective pluralities of parallel lines disposed at respective different levels above the common conductive region.

17. The device of claim 3, wherein the at least one second selection line is disposed on a side of the at least one first selection line opposite the common conductive region, and wherein the second selection lines are aligned with the horizontal electrodes.

18. The device of claim 3, further comprising selection gate dielectric regions disposed on sidewalls of the semiconductor pillars.

19. The device of claim 18, wherein the sidewalls of the semiconductor pillars are covered by the selection gate dielectric regions.

20. The device of claim 18, wherein the selection gate dielectric regions comprise a first dielectric region disposed at a level of the at least one first selection line and a second dielectric region disposed at a level of the at least one second selection line.

* * * * *